US009959736B2

(12) United States Patent
Jain

(10) Patent No.: US 9,959,736 B2
(45) Date of Patent: May 1, 2018

(54) SYSTEM AND METHOD FOR MONITORING AND CONTROLLING A TRANSFORMER

(71) Applicant: Virginia Transformer Corporation, Roanoke, VA (US)

(72) Inventor: Prabhat Jain, Roanoke, VA (US)

(73) Assignee: Virginia Transformer Corporation, Roanoke, VA (US)

( * ) Notice: Subject to any disclaimer, the term of this patent is extended or adjusted under 35 U.S.C. 154(b) by 0 days. days.

(21) Appl. No.: 15/238,407

(22) Filed: Aug. 16, 2016

(65) Prior Publication Data
US 2017/0011612 A1 Jan. 12, 2017

Related U.S. Application Data

(63) Continuation-in-part of application No. 13/716,988, filed on Dec. 17, 2012, now Pat. No. 9,442,150.

(60) Provisional application No. 61/576,590, filed on Dec. 16, 2011.

(51) Int. Cl.
| G08B 21/00 | (2006.01) |
| G08B 21/18 | (2006.01) |
| H01F 27/40 | (2006.01) |
| H01F 27/08 | (2006.01) |
| H01F 27/00 | (2006.01) |
| G01R 31/02 | (2006.01) |

(52) U.S. Cl.
CPC ......... *G08B 21/182* (2013.01); *G01R 31/027* (2013.01); *H01F 27/008* (2013.01); *H01F 27/08* (2013.01); *H01F 27/402* (2013.01); *H01F 2027/404* (2013.01); *H01F 2027/406* (2013.01)

(58) Field of Classification Search
CPC .................................................. G08B 21/182
USPC ........................................................ 340/626
See application file for complete search history.

(56) References Cited

U.S. PATENT DOCUMENTS

| 4,654,806 A | 3/1987 | Poyser et al. | |
| 6,906,630 B2 | 6/2005 | Georges et al. | |
| 2002/0180611 A1* | 12/2002 | Weekes | H02H 7/04 340/646 |
| 2008/0074073 A1* | 3/2008 | Genkawa | H02P 13/06 318/779 |
| 2009/0315657 A1* | 12/2009 | Hoffman | H01F 27/085 336/57 |
| 2010/0130142 A1* | 5/2010 | Schubert | H01R 13/66 455/90.3 |
| 2011/0196546 A1* | 8/2011 | Muller | H02J 3/383 700/295 |
| 2013/0024032 A1* | 1/2013 | Vukojevic | H02J 3/1828 700/291 |
| 2013/0054165 A1* | 2/2013 | Ramirez | G01R 22/061 702/62 |
| 2014/0053626 A1* | 2/2014 | Jeffrey | G01N 33/2841 73/19.1 |
| 2014/0233605 A1* | 8/2014 | Rasor | G01N 33/2841 374/142 |

(Continued)

*Primary Examiner* — Santiago Garcia
(74) *Attorney, Agent, or Firm* — McGuireWoods LLP

(57) ABSTRACT

A system, a method and a computer program to monitor a plurality of transformer operating parameters, as well as to accurately control one or more of the transformer operating parameters. Also, the system and method may calculate loss of life and give diagnosis for recovery and provide maintenance notification, along with monitoring the operation of the LTC.

9 Claims, 23 Drawing Sheets

(56) References Cited

U.S. PATENT DOCUMENTS

2015/0243428 A1* 8/2015 Divan .................... H01F 29/02
323/340

* cited by examiner

SYSTEM AND METHOD FOR MONITORING AND CONTROLLING A TRANSFORMER

CROSS-REFERENCE TO RELATED APPLICATIONS

This is a continuation-in-part application of copending U.S. patent application Ser. No. 13/716,988 filed Dec. 17, 2012 which claims benefit and priority to U.S. Provisional Patent Application No. 61/576,590 filed Dec. 16, 2011, the disclosures of which are incorporated by reference herein in their entirety.

BACKGROUND 1.0 Field of the Disclosure

The present disclosure relates to a system, a method, and a computer program for monitoring a plurality of transformer operating parameters, including temperature, transformer fluid level, pressure, load, gas generation, and the like. The present disclosure further relates to a system, a method, and a computer program for accurately monitoring, analyzing and predicting one or more transformer operating parameters including, e.g., oil and winding temperature, transformer liquid level, fluid pressure, transformer life, and controlling one or more transformer operating parameters, including, e.g., temperature, transformer fluid level, pressure, transformer life. The present disclosure further relates to performing diagnosis of the operation of a transformer based on the levels of the parameters, and the parameters may be communicated on a wired/wireless network.

2.0 Related Art

Current electrical power generation systems and electrical power supply systems use a wide variety of transformer designs to transform electrical power from a primary voltage (e.g., input voltage) to a secondary voltage (e.g., output voltage). Electrical transformers are typically used to transfer electrical energy between circuits through inductively coupled conductors.

Transformers generally include a core, wound conductors (i.e., a winding assembly), and a housing, The housing may include a tank that contains transformer liquid, such as, e.g., mineral oil, to insulate and absorb heat from the core and winding assembly, which may be immersed in the transformer liquid. The external walls of the tank and/or housing may include a plurality of vanes to transfer heat to the ambient environment.

Currently, monitoring systems are implemented to monitor transformer operations, and to detect faults. U.S. Pat. No. 4,654,806 to Thomas D. Poyser, et al., discloses an example of a method and apparatus for monitoring transformers. U.S. Pat. No. 6,906,630 to Bruno Georges, et al., discloses another example of a transformer management system and method.

Since improper performance or transformer failure can result in power disruption, fluctuating power supply, or power outage, loss of transformer life, it is important to provide accurate measurement, analysis and monitoring of transformer parameters, so as to facilitate timely intervention.

SUMMARY OF THE DISCLOSURE

The disclosure provides a system, a method and a computer program to monitor a plurality of transformer operating parameters, and to control or facilitate control of transformer parameters for optimal transformer performance, including the diagnosis, and access and control of the parameters on the wired/wireless network. It also provides information on the various tap positions of the load tap changer (LTC). Further it also predicts the percentage of loss of life based on the loading and other parameters. Other parameters may include internal temperature and outside temperature. It also provides the condition of possible faults in the transformer based on the inputs from the gas analyzer.

In one aspect, a system for monitoring operating parameters of a transformer is provided that includes a temperature sensor that measures temperature in the transformer and outputs a temperature signal, a fluid level sensor that measures a level of fluid in the transformer and outputs a fluid level signal, a pressure sensor that measures pressure in the transformer and outputs a pressure signal and a processor that receives the temperature signal, the fluid level signal, and the pressure signal, wherein the processor is configured to generate a diagnosis signal based on at least one of the temperature signal, fluid level signal, and pressure signal. The system may further comprise a current transmitter that measures the current in the transformer and outputs a current signal and a temperature sensor that measures the surrounding ambient temperature of the transformer and outputs an ambient temperature signal, wherein the processor is configured to generate a diagnosis signal based on at least one of the current signal and the ambient temperature signal. The system may further comprise a gas analyzer to provide a signal for gases generated in the transformer wherein the processor is configured to generate a diagnosis signal based on the signal for gases.

In one aspect, a method for monitoring or controlling a transformer includes the steps of sending at least one threshold value to a transformer monitoring device, receiving at least one signal from the transformer monitoring device indicative of a condition of a transformer that exceeded the at least one threshold value and raising an alarm indicating a potential fault or unwanted condition at the transformer. The method may further include at least one of the following steps: receiving a temperature signal from the transformer monitoring device indicative of a temperature of the transformer, receiving a fluid level signal from the transformer monitoring device indicative of a fluid level in the transformer, receiving a pressure level signal from the transformer monitoring device indicative of an amount of pressure in the transformer, receiving a current signal from the transformer monitoring device indicative of a current in the transformer, receiving an ambient temperature signal from the transformer monitoring device indicative of the surrounding ambient temperature of the transformer, receiving a gas signal from the transformer monitoring device indicating a level of gases generated in the transformer, receiving a LTC position signal from the transformer monitoring device indicative of a position of the LTC position, monitoring a rate of change in the temperature signal, a rate of change in the fluid level signal and a rate of change in the pressure level and outputting a signal based on a threshold being exceeded between any of these rate of change signals for determining a fault, calculating a percent loss of life of the transformer based on at least one of the signals exceeding a parameter, wherein the step of raising an alarm raises an alarm based on at least one of the signals. The method may further include the following steps receiving a temperature signal from the transformer monitoring device indicative of a temperature of the transformer, receiving a fluid level signal from the transformer monitoring device indicative of a fluid level in the transformer, receiving a pressure level signal from the transformer monitoring device indicative of an amount of pressure in the transformer; receiving a current signal from the transformer monitoring device indicative of current in the transformer, receiving an ambient temperature signal from the transformer monitoring device indicative of the surrounding ambient temperature of the transformer, receiving a gas signal from the transformer monitoring device indicating a level of gases generated in the transformer, receiving a LTC position signal from the transformer monitoring device indicative of a position of the LTC position, monitoring a rate of change in the temperature signal, a rate of change in the fluid level signal and a rate of change in the pressure level and outputting a signal based on a threshold being exceeded between any of these rate of change signals for determining a fault, calculating a percent loss of life of the transformer based on at least one of the signals exceeding a parameter, wherein the step of raising an alarm raises an alarm based on at least any of the signals, or the calculated percent loss of life. Moreover, in each of the receiving steps, each respective signal may be received over a wireless link. The method for monitoring or controlling a transformer may include all of the steps. Alternatively, the method for monitoring or controlling a transformer may include any combination of the steps.

In one aspect, a computer program embodied on a computer readable storage medium is provided, the computer program comprising executable code that when read and executed by a processor performs the following steps receiving a temperature signal from a transformer monitoring device indicative of a temperature of a transformer, receiving a fluid level signal from the transformer monitoring device indicative of a fluid level in the transformer, receiving a pressure level signal from the transformer monitoring device indicative of an amount of pressure in the transformer, receiving a current signal from the transformer monitoring device a current transmitter that measures the current in the transformer and outputs a current signal, receiving an ambient temperature signal from the transformer monitoring device indicative of the surrounding ambient temperature of the transformer, receiving a gas signal from the transformer monitoring device indicating a level of gases generated in the transformer, receiving a LTC position signal from the transformer monitoring device indicative of a position of the LTC position, monitoring a rate of change in the temperature signal, a rate of change in the fluid level signal and a rate of change in the pressure level and outputting a signal based on a threshold being exceeded between any of these rate of change signals for determining a fault, calculating a percent loss of life of the transformer based on at least one of the signals exceeding a parameter and raising an alarm based on at least one of: any of the signals and calculated percent loss of life of the transformer.

In one aspect, a system for monitoring operating parameters of a transformer includes a temperature sensor that measures temperature in the transformer and outputs a temperature signal, a winding current sensor that measures current in the windings of the transformer and outputs a current signal, a processor that wirelessly receives the temperature signal and the current signal, wherein the processor calculates a percentage loss of life values of the transformer based on a plurality of: the temperature signal, the current signal, a thermal capacity of the transformer, oil and winding-time constants, winding gradients, and ambient temperature. The processor further may calculate the percentage of loss of life based on moisture content in both of: the transformer and paper insulation.

In one aspect, a system for monitoring operating parameters of a transformer includes a dissolved gas sensor to measure dissolved gases in the transformer oil and a processor that wirelessly receives the measured dissolved gas and raising an alarm when the level of dissolved gas exceeds a predetermined threshold. The predetermined threshold may be programmable over a network.

In one aspect, a system for monitoring operating parameters of a transformer includes a sensor that senses the LTC tap position from among a plurality of positions and outputs a LTC position signal, a processor that receives the LTC position signal and generates a diagnosis signal based on the LTC position signal. The processor may generate the diagnosis signal and may send the signal over a wireless network. The processor may raise an alert when the LTC tap is at minimum tap position, maximum tap position, nominal tap position and when the tap struck between two taps. The processor may provide LTC operation counter information. The processor may generate the diagnosis signal on a touch sensitive screen.

In one aspect, a system for monitoring operating parameters of a transformer includes a processor that receives over a wireless communication link one or more signals that convey information from a plurality of transformer sensors, the information including sensed LTC tap position from among a plurality of LTC positions, dissolved gas level, oil temperature, fluid level, pressure level and transformer winding current, wherein the processor is configured to program threshold levels over the wireless communication link related to the plurality of the transformer sensors. The processor may output recommendations to a display based on the received one or more signals for responding to the one or more signals.

In one aspect, a system for monitoring operating parameters of a transformer includes a temperature sensor that measures temperature in the transformer and outputs a temperature signal, a winding current sensor that measures current in the windings of the transformer and outputs a current signal, a dissolved gas sensor to measure dissolved gases in the transformer, a sensor that senses the LTC tap position from among a plurality of positions and outputs a LTC position signal and a processor that receives over a wireless communication link the temperature signal and the current signal, wherein the processor calculates a percentage loss of life values of the transformer based on a plurality of: the temperature signal, the current signal, a thermal capacity of the transformer, oil and winding-time constants, winding gradients, and ambient temperature, and the processor receives over the wireless communication link the measured dissolved gas and raising an alarm when the level of dissolved gas exceeds a predetermined threshold, and the processor receives the LTC position signal and generates a diagnosis signal based on the LTC position signal, and the processor receives over the wireless communication link one or more signals that convey information from a plurality of transformer sensors, the information including sensed LTC tap position from among a plurality of LTC positions, dissolved gas level, oil temperature, fluid level, pressure level and transformer winding current, wherein the processor is configured to program threshold levels over the wireless communication link related to a plurality of sensors. The plurality of sensors may comprise a built-in package pre-installed during the transformer manufacturing stage.

In one aspect, a system for monitoring operating parameters of a transformer includes a controller operatively connected to a plurality of transformer sensors, the controller programmed with predetermined thresholds related to each of the plurality of sensors, a touch screen display connected to the controller, the controller causing the touch screen display to display a plurality of graphical user interfaces selected from:

a) a tank pressure indicator,
b) a sudden pressure relay alarm,
c) a pressure relief device alarm,
d) a liquid level indicator,
e) a short circuit indicator,
f) a fans test input interface,
g) a load tap changer (LTC) indicator,
h) a LTC tap position indicator,
i) a LTC temperature indicator,
j) a annunciator display summarizing multiple statuses related to the plurality of transformer sensors, and
k) a summary screen showing status of a plurality of transducers.

The predetermined thresholds may be programmable over a network, and the controller sends an alarm when at least one threshold is exceeded. The tank pressure indicator may include a high pressure set point setting and a low pressure set point setting. The liquid level indicator may comprise status for a high level alarm, a low level alarm and a low-low level alarm. The short circuit indicator may include a total short circuit indicator, an indicator of short circuits over a predetermined time period, and a history of short circuits by date. The LTC indicator may include one or more of a LTC Global operations counter, a LTC operations counter, and a set point for maintenance indicator. The LTC tap position indicator may indicate at least one of: an External Low position, an External High position, a Neutral position and a Off-Tap position. The temperature indicator may indicate a top oil temperature, a LTC temperature, a LTC differential temperature and a LTC differential set point. The controller may be configured to cause the touch screen display to display each of the graphical user interfaces a-k.

In one aspect, a transformer includes a transformer and a built-in monitoring package including a controller, a sensor box, a dissolved gas analyzer (DGA), a moisture sensor and additional sensors pre-installed and wired. The built-in monitoring package may further includes a touch screen display. The additional sensors include a plurality of, in any combination:

a) a tank pressure sensor,
b) a sudden pressure relay sensor,
c) a pressure relief device sensor,
d) a liquid level sensor,
e) a short circuit sensor,
f) an $H_2$ sensor,
g) a load tap changer (LTC) position sensor,
h) a LTC oil temperature sensor,
i) a low pressure sensor,
j) a fan activation sensor, and
k) a short circuit sensor.

Additional features, advantages, and embodiments of the disclosure may be set forth or apparent from consideration of the detailed description and drawings. Moreover, it is noted that the foregoing summary of the disclosure and the following detailed description and drawings provide non-limiting examples of the disclosure, which are intended to provide explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

Figure 1:
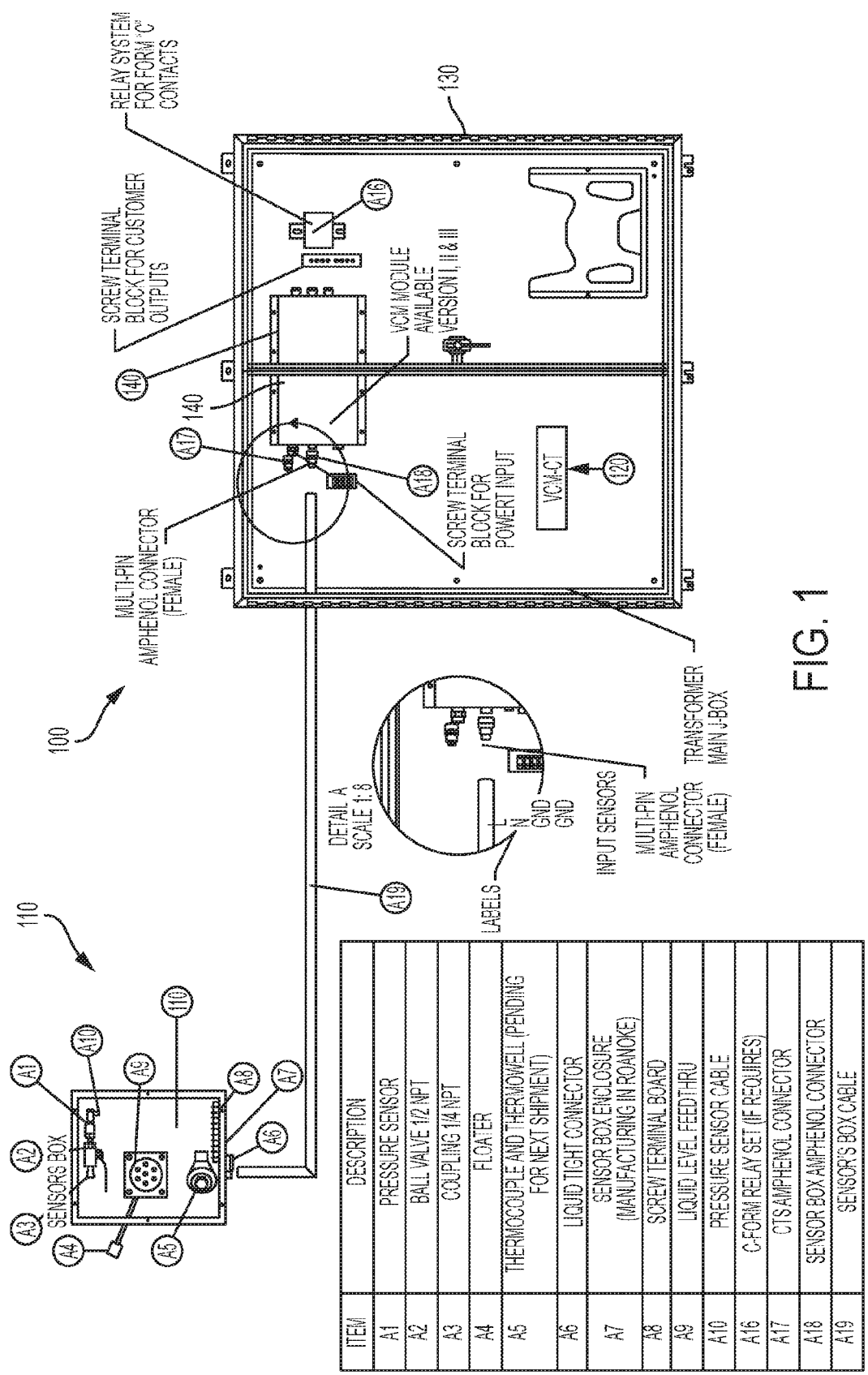
FIG. 1 shows an example of a transformer monitoring system.

The present disclosure is further described in the detailed description that follows.

DETAILED DESCRIPTION OF THE DISCLOSURE

The disclosure and the various features and advantageous details thereof are explained more fully "with reference to the non-limiting embodiments and examples that are described and/or illustrated in the accompanying drawings and detailed in the following description. It is noted that the features illustrated in the drawings and attachment are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

A "computer," as used in this disclosure, means any machine, device, circuit, component, or module, or any system of machines, devices, circuits, components, modules, or the like, which are capable of manipulating data according to one or more instructions, such as, for example, without limitation, a processor, a microprocessor, a programmable logical controller, a controller, a central processing unit, a general purpose computer, a super computer, a personal computer, a laptop computer, a palmtop computer, a notebook computer, a cloud computer, a desktop computer, a workstation computer, a server, or the like, or an array of processors, microprocessors, central processing units, general purpose computers, super computers, personal computers, laptop computers, palmtop computers, notebook computers, desktop computers, workstation computers, servers, or the like.

A "server," as used in this disclosure, means any combination of software and/or hardware, including at least one application and/or at least one computer to perform services for connected clients as part of a client-server architecture. The at least one server application may include, but is not limited to, for example, an application program that can accept connections to service requests from clients by sending back responses to the clients. The server may be configured to run the at least one application, often under heavy workloads, unattended, for extended periods of time with minimal human direction. The server may include a plurality of computers configured, with the at least one application being divided among the computers depending upon the workload.

For example, under light loading, the at least one application can run on a single computer. However, under heavy loading, multiple computers may be required to run the at least one application. The server, or any if its computers, may also be used as a workstation.

A "database," as used in this disclosure, means any combination of software and/or hardware, including at least one application and/or at least one computer. The database may include a structured collection of records or data organized according to a database model, such as, for example, but not limited to at least one of a relational model, a hierarchical model, a network model or the like. The database may include a database management system application (DBMS) as is known in the art. The at least one application may include, but is not limited to, for example, an application program that can accept connections to service requests from clients by sending back responses to the clients. The database may be configured to run the at least one application, often under heavy workloads, unattended, for extended periods of time with minimal human direction.

A "communication link," as used in this disclosure, means a wired and/or wireless medium that conveys data or information between at least two points. The, wired or, wireless medium may include, for example, a metallic conductor link, a radio frequency (RF) communication link, an Infrared (IR) communication link, an optical communication link, or the like, without limitation. The RF communication link: may include, for example, Ethernet, WiFi, WiMAX, IEEE 802.11, DECT, 0G, 1G, 2G, 3G or 4G cellular standards, Bluetooth, and the like.

A "network", as used in this disclosure means, but is not limited to, for example, at least one of a local area network: (LAN), a wide area network (WAN), a metropolitan area network (MAN), a personal area network (PAN), a campus area network, a corporate area network, a global area network (GAN), a broadband area network (BAN), a cellular network, the Internet, or the like, or any combination of the foregoing, any of which may be configured to communicate data via a wireless and/or a wired communication medium. These networks may run a variety of protocols not limited to TCP/IP, IRC or HTTP.

The terms "including," "comprising," and variations thereof, as used in this disclosure, mean "including, but not limited to," unless expressly specified otherwise.

The terms "a," "an," and "the," as used in this disclosure, means "one or more," unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

A "computer-readable medium," as used in this disclosure, means any medium that participates in providing data (for example, instructions) which may be read by a computer, Such a medium may take many forms, including non-volatile media, volatile media, and transmission media. Non-volatile media may include, for example, optical or magnetic disks and other persistent memory. Volatile media may include dynamic random access memory (DRAM). Transmission media may include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read. The computer-readable medium may include a "Cloud," which includes a distribution of files across multiple (e.g., thousands of) memory caches on multiple (e.g., thousands of) computers.

Various forms of computer readable media may be involved in carrying sequences of instructions to a computer. For example, sequences of instruction (i) may be delivered from a RAM to a processor, (ii) may be carried over a wireless transmission medium, and/or (iii) may be formatted according to numerous formats, standards or protocols, including, for example, WiFi, WiMAX, IEEE 802.11,DECT, 0G, 1G, 2G, 3G or 4G cellular standards, Bluetooth, or the like.

FIG. 1 shows an example of a transformer monitoring/control (TMC) system 100, constructed according to the principles of the disclosure. The TMC system 100 includes a sensor box 110, an alternating current (AC) transmitter 120, a transformer main box 130, and a transformer control/monitoring module (VCM) 140. The TMC system 100 further includes the components 1-20 as noted in FIG. 1, which form part of the instant specification. The sensor box 110 may include, or it may be coupled to, a plurality of sensors, including a temperature sensor, a transformer fluid level sensor, a pressure sensor, ambient sensor and the like. As described below, VMC 14, VCM 140, VCM 1400, VCM3 are examples of different variants of a transformer control/monitoring module, which may include one or more features from one another variant.

Figure 2:
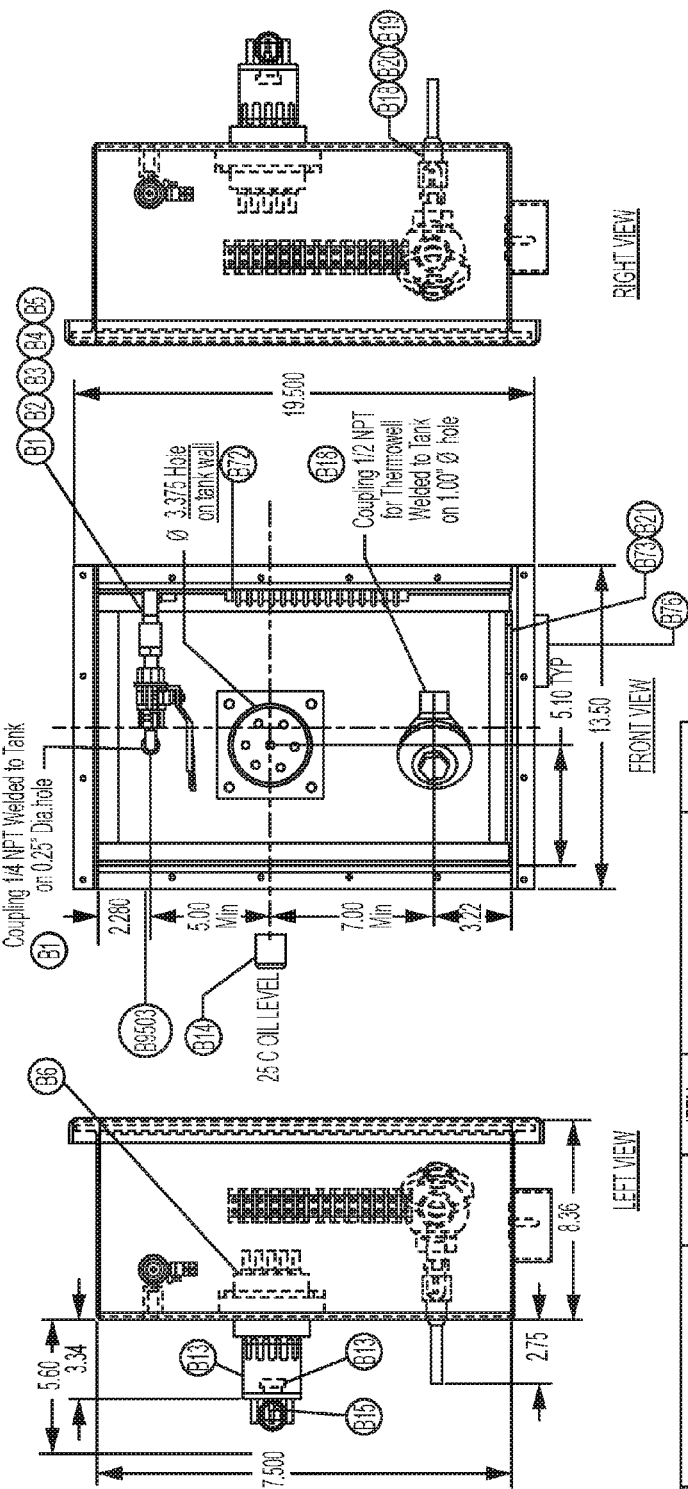
FIG. 2 shows an example of a sensor box including a left view, front view and right view.

FIG. 2 shows an example of the sensor box 110, including, e.g., a ball valve, a LL assembly, a pressure sensor, a screw terminal block, and a thermowell. Moreover, any sensor described herein may be adapted for wireless communication and communicate wirelessly to a controller (e.g., controller 2025) and/or remote monitoring station (e.g., computer 2110), either directly or indirectly.

Figure 3B:
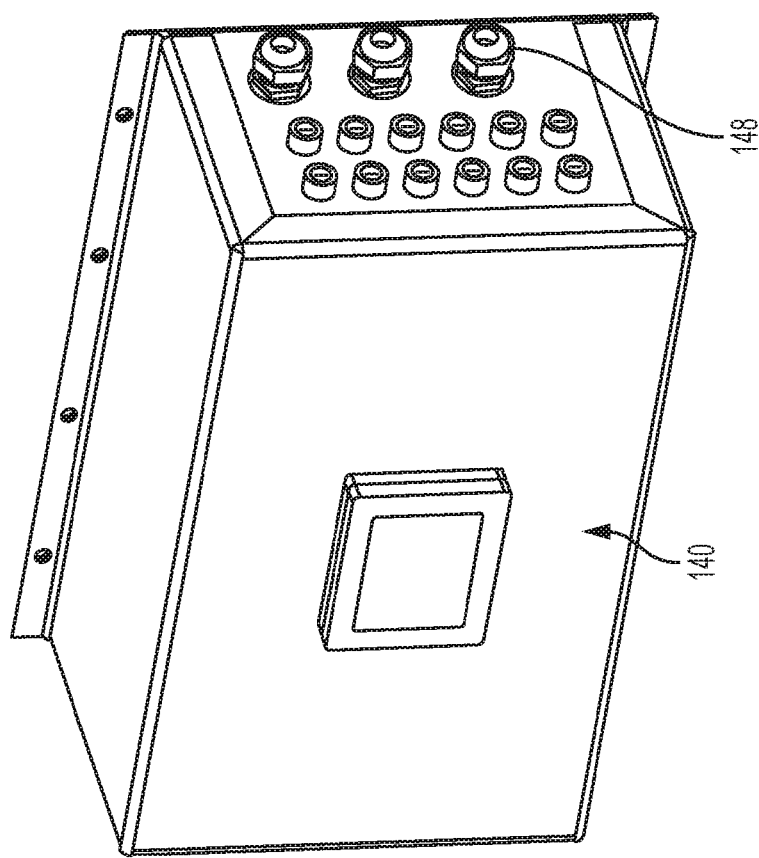
FIGS. 3A and 3B show front and left and right perspective views, respectively, of an example of a transformer control/monitoring module (VCM)
Figure 3A:
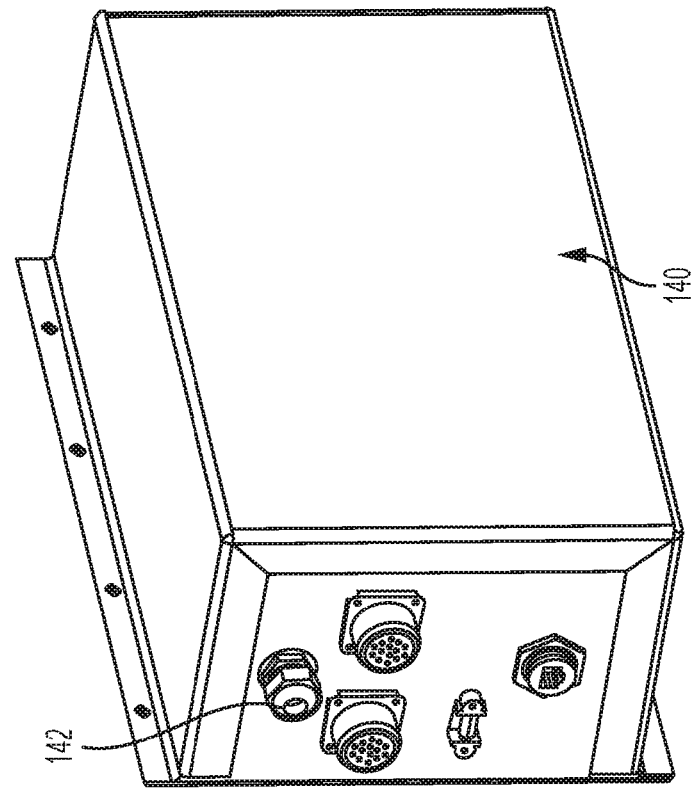

FIGS. 3A and 3B show front and back perspective views, respectively, of an example of the VCM 140. The VCM 140 includes housing with a front panel (VCM2 Screen) and left panel 142 and a right panel 148. The left panel 142 may include a plurality of inputs. The right panel 148 may include a plurality of outputs. The VCM 140 housing may be adapted to be fixable to a wall (e.g., a transformer wall) or other planar surface via a fastening mechanism, such as, for example, a plurality of welds, screws, bolts, nuts, rivets, or the like.

Figure 4:
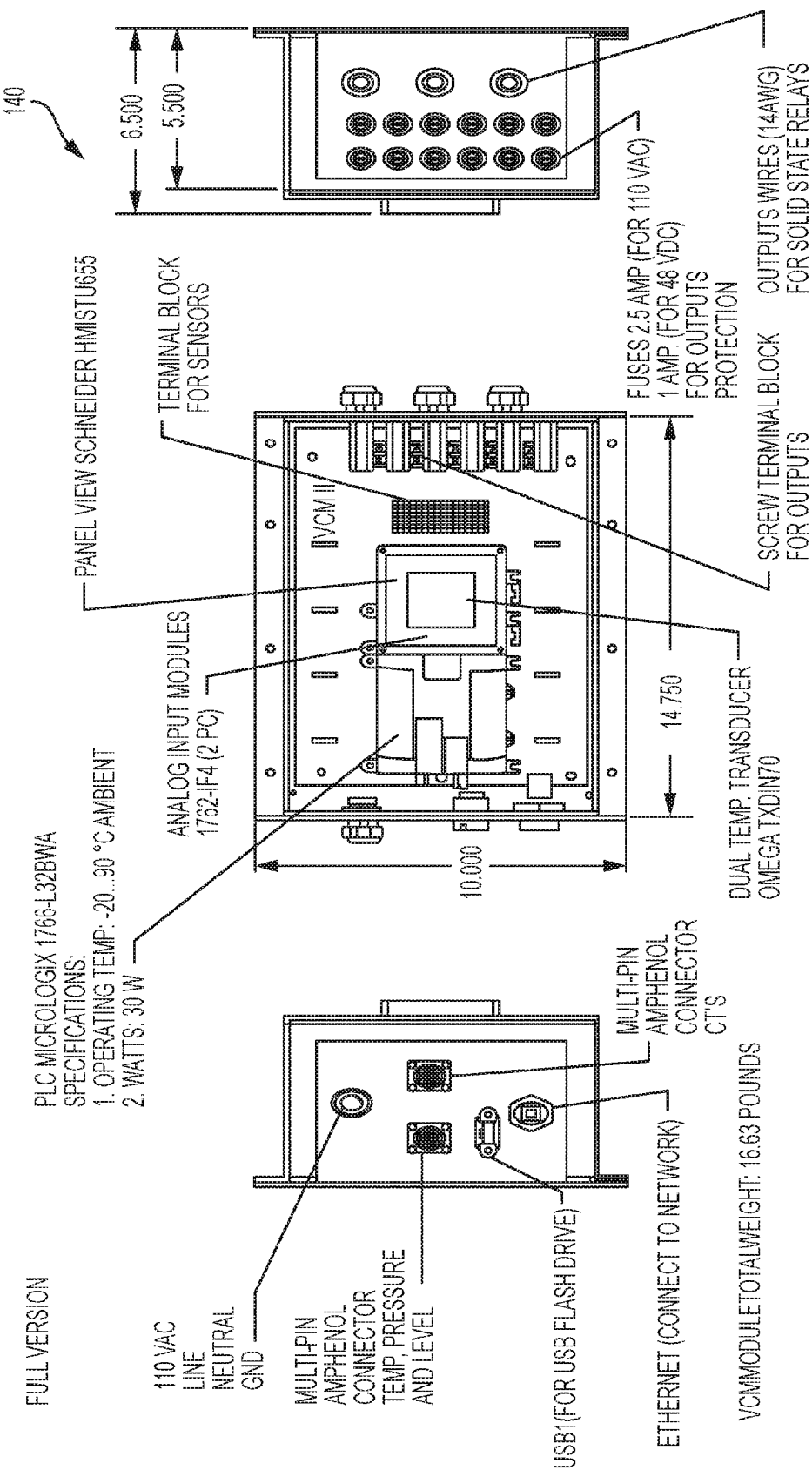
FIG. 4 shows a front view, a side view, and a back view of the VCM of FIGS. 3A, 3B.

FIG. 4 shows a front view, a left side view, and a right side view of a full version VCM 140. The VCM 140 may include a power supply input (e.g., 110 VAC), a multi-pin amphenol connector, a USB connector, a network connector (e.g., Ethernet), a programmable logic controller (PLC) module (e.g., such as PLC Micrologix 1766-L32BWA), one or more analog input modules (e.g., such as 1762-IF4 (2PC)), a panel (e.g., such as Schneider HMISTU655), a terminal block for sensors, a dual temperature transducer (e.g., such as Omega TXDIN70), a screw-terminal block, a plurality of fuses, and a plurality of outputs.

Figure 5:
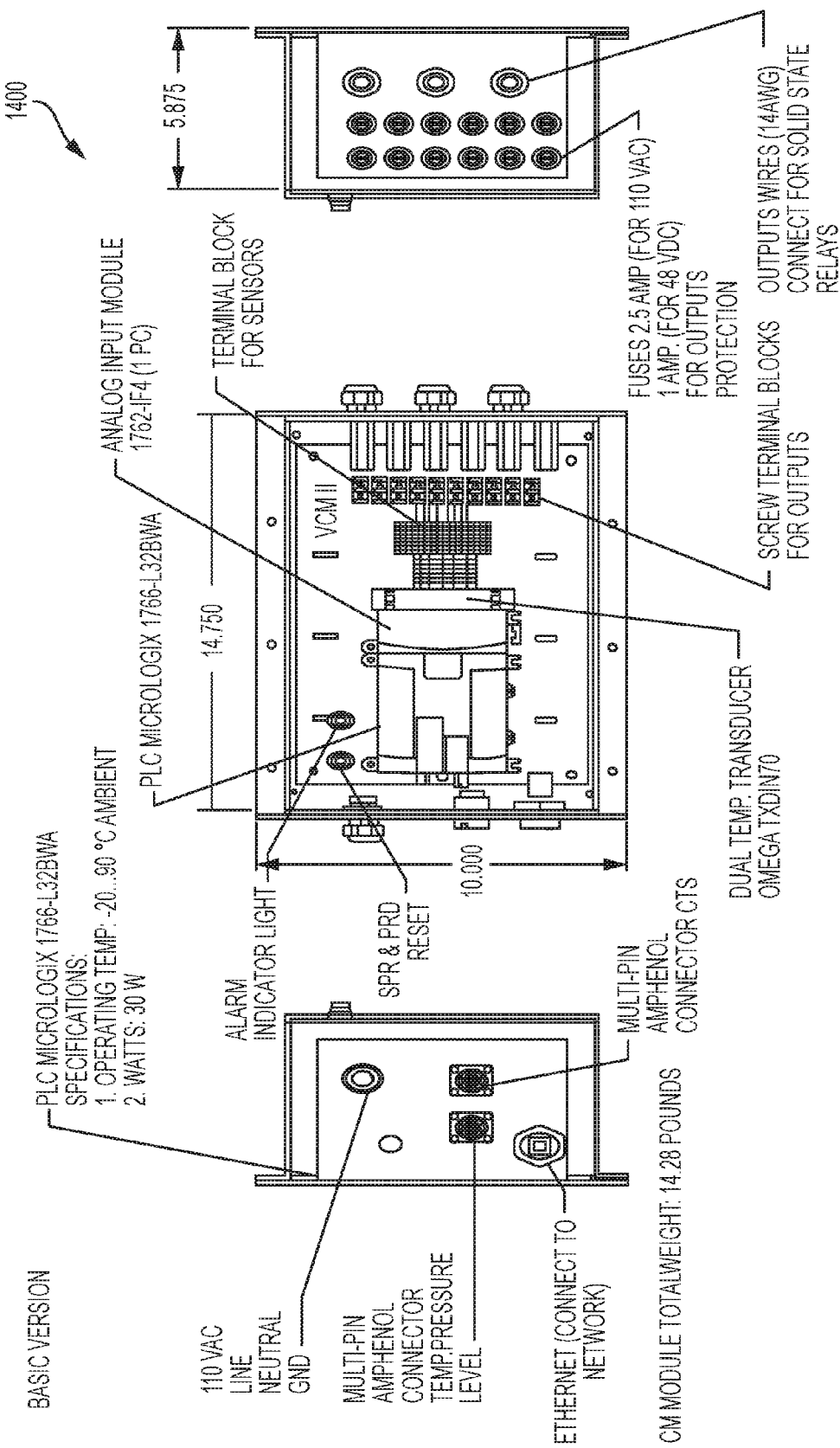
FIG. 5 shows a front view, a side view, and a back view of another example of a VCM.

FIG. 5 shows a front view, a left side view, and a right side view of another example of a VCM, a basic version VCM 1400. The VCM 1400 may be similarly configured to the VCM 140. The VCM 1400 may further include an alarm indicator light, and a SPR & PRD reset.

Figure 6:
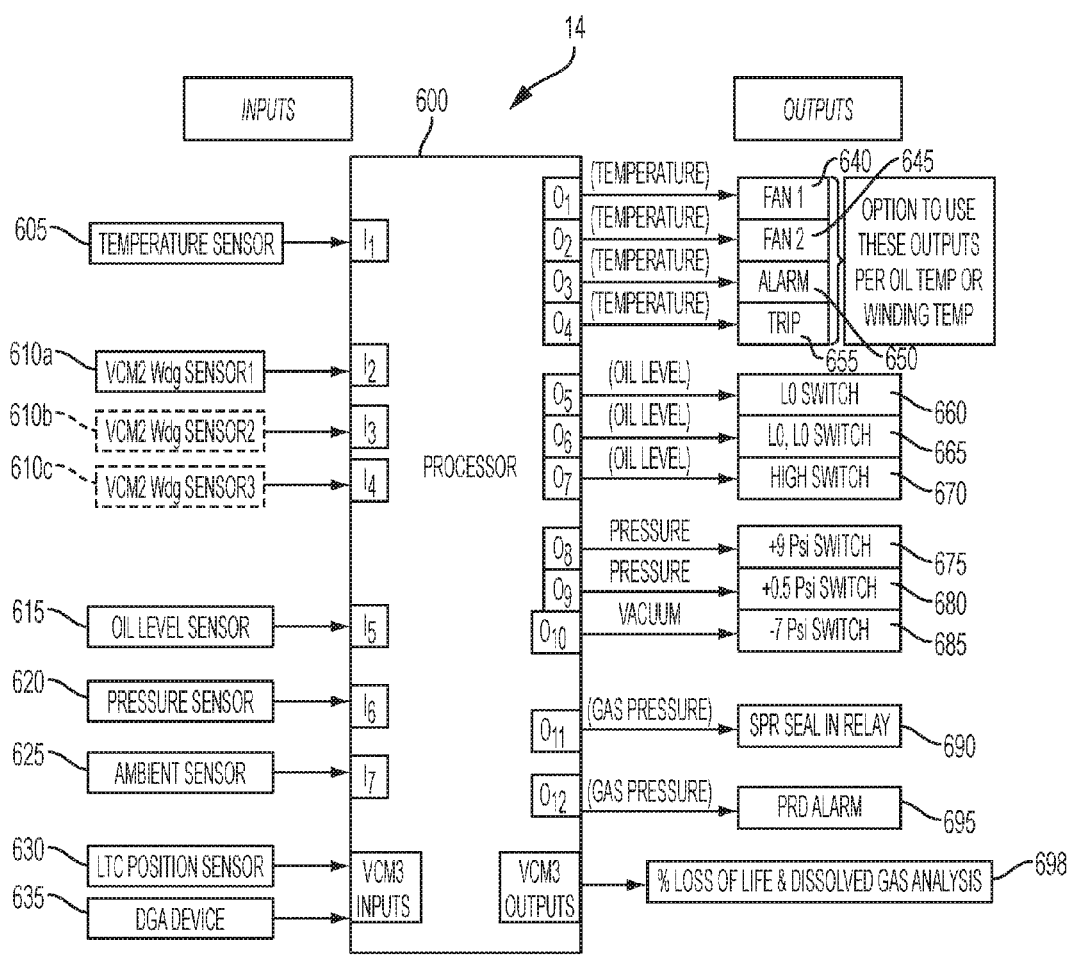
FIG. 6 shows a schematic view of the VCM of FIGS. 3A, 3B.

FIG. 6 shows a schematic view of an example of a VCM 14 constructed according to the principles of the disclosure. The VCM 14 may include a processor (or computer) 600, a plurality of inputs and a plurality of outputs. The VCM 14 may be coupled to a plurality of sensors associated with a transformer for monitoring the state of the transformer, including an oil temperature sensor 605, at least one WTI CT transmitter sensor(s) 610a-610c, an oil level sensor 615, a gas pressure sensor 620, ambient sensor 625 and a LTC position sensor 630. A dissolved gas analyzer 635 may also provide inputs to the processor 600. The VCM 14 may be coupled to a plurality of relays, switches, actuators, and the like, including, for example, a temperature fan-1 relay 640, a temperature fan-2 relay 645, a temperature alarm relay 650, a temperature trip relay 655, an oil level Lo switch 660, an oil level Lo Lo switch 665, an oil level High switch 670, a pressure switch (+9 Psi) 675, a pressure switch (+0.5) 680, a vacuum relay (−7 Psi) 685, a gas pressure SPR seal in relay activation relay 690, and a gas pressure PRD alarm activation relay 695. The processor may output percentage loss of life and dissolved gas analysis 698.

In some applications, the VCM 14 may be configured to take the inputs from the LTC position sensor, and may raise an alert when the LTC tap is at minimum tap position, maximum tap position, nominal tap position and when the tap struck between two taps. Also it provides the LTC operation counter information.

In some versions, the VCM 14 may be configured to calculate the percentage loss of life values of the transformer based on the algorithm developed based on one or more of: thermal capacity of the transformer (time constant), oil- and winding-time constants, winding gradients and hot-spot temperatures, loading of the transformer, the standards on loading guide such as IEEE Std C57.91 and the ambient temperature. Any of these may be taken into account in the algorithm to compute the percentage loss of life. Many of the parameters may be aggregated over time to account for the thermal time constant, hot spot temperature is monitored/calculated and used as one of the parameters to calculate the loss of life. It can track the loss of life over a certain period of time and indicate the trend. Also it may alert (e.g., raise an alarm) the customer when a threshold value (i.e., a parameter is exceeded) of the % loss of life is reached.

The loss of life calculation may be performed in any embodiment by identifying the ambient temperature, the top oil temperature and the load current. The aging acceleration factor ($F_{AA}$) may be calculated to obtain the equivalent aging for a predetermined interval, e.g., daily, monthly and/or yearly interval. The winding hottest spot rise and the top oil temperature rise may be obtained from the transformer thermal design and transformer test reports. The load current may be determined by the use of current transformers to continuously measure the current flowing through the windings. The $F_{AA}$ may then be used to calculate the percentage loss of life over the predetermined interval(s) by considering the expected normal insulation life, defined typically as 526830 hours.

In some versions, the VCM 14 (and VCM3) may be configured to receive inputs (i.e., gas signals) from the gas analyzer devices based on the algorithm based on the quantities and the rates of the gases generated and determines the status of the transformer in scale of conditions 1 through 4 as defined in the IEEE Std C57.104, provides tracking of the trend of the gases and recommends actions to be taken based on the trend and severity of condition above. Input and output details are added to the FIG. 6.

Figure 7:
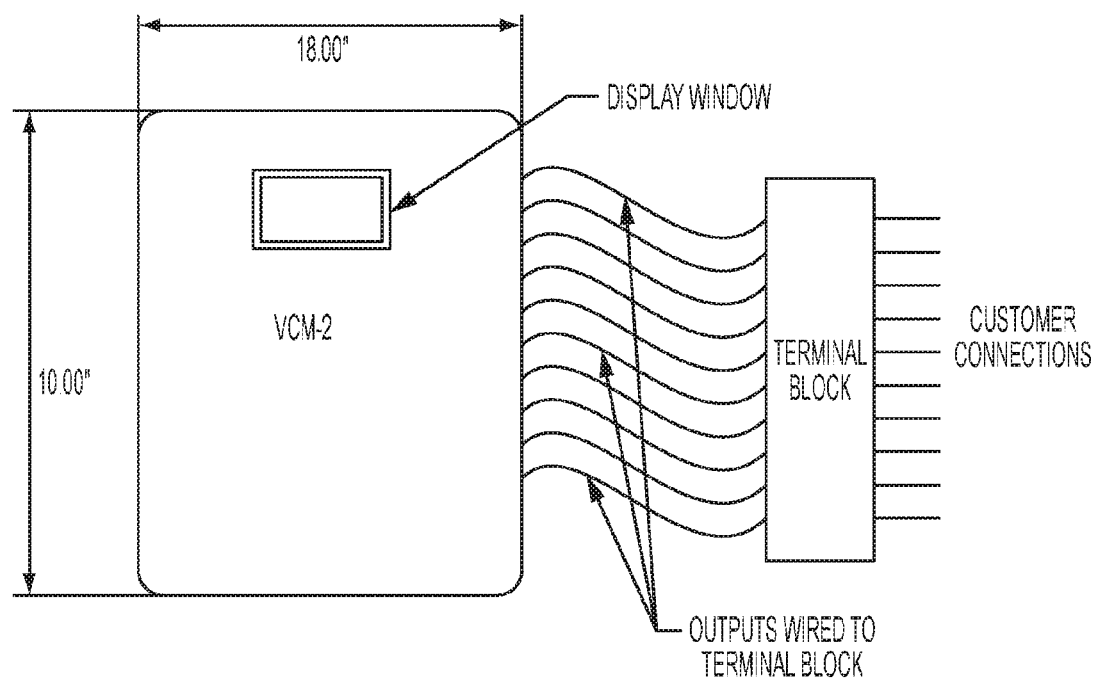
FIG. 7 shows an example of a VCM coupled to a terminal block.

FIG. 7 shows an example of the VCM 14 coupled to a terminal block that leads to a customer's connections, according to the principles of the disclosure.

Figure 8:
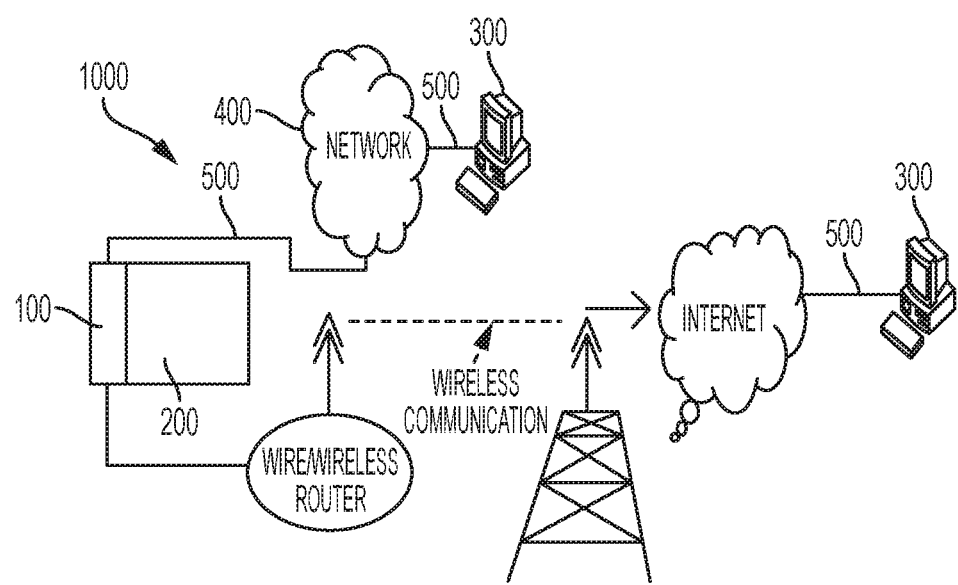
FIG. 8 shows an example of a VCM communication system.

FIG. 8 shows a VCM communication system 1000, constructed according to the principles of the disclosure. The VCM system 1000 includes the TMC system 100, which may be coupled to a transformer 200, a computer 300, and a network 400, all of which may be coupled via communication links 500. The TMC system 100 may be located remotely from the transformer 200, in which case a plurality of sensors may be located at (or near, or in) the transformer 200, each of which may be coupled to the TMC system 100. VCM system 1000 may be configured to communicate data using wireless communication technology. VCM 100 may send data through a wire/wireless Router. Computer 300 may receive or send data via an internet service provider (ISP). The wireless and wired communication may be supervisory control and data acquisition (SCADA) compatible. The data can be received, and communication established with a user using this wireless connection. Alternatively, a user can also communicate with a hard wire SCADA connection. The computer 300 may access any parameter and set any threshold at the TCM system 100.

Referring to FIGS. 1-8, the VCM 14 (140, 1400) may be coupled to a plurality of sensors (e.g., solid state sensors) that measure operating parameters, including, temperature, fluid level, pressure, current, and voltage in the transformer 200. The sensor may continuously or intermittently measure the operating parameters. The plurality of sensors output measurement signals, which include a temperature signal, a fluid level signal, a pressure signal, a current signal, and a voltage signal. The measurement signals may be digital or analog. The VCM may receive the plurality of measurement signals of the transformer operation and that of the other devices monitoring the transformer, and process the received signals for various different goals, including, for example, to simulate: the function of a Sudden Pressure Relay (SPR) device on the transformer 200; the winding temperature in the transformer 200; and the activation of the Pressure Relief Device. Thus, an SPR may be eliminated or not included. Similarly, a contact for a PRD may be eliminated or not included.

As seen in FIG. 8, the TMC system 100 may be affixed to, or located near the transformer 200. The TMC 100 may receive (or transmit) data from the computer 300 via the communication link(s) 500 directly or through the network 400. The TMC 100 may allow a user to access and control the TMC 100 via the computer 300 from anywhere in the world. Further, the user may access and/or control the transformer 200 via the computer 300 (and the TMC 100) from anywhere in the world.

The TMC 100 may be configured to receive and process one or more measurement signals from one or more sensors to generate one or more correction parameters. The correction parameters may include, for example, a temperature correction, a fluid level correction, a pressure collection, a voltage correction, a current correction, and the like. The TMC 100 may generate the correction parameters by comparing a measurement signal (e.g., a temperature measurement signal, a fluid level measurement signal, a pressure measurement signal, a voltage measurement signal, a current measurement signal, and the like) to a threshold value for the respective operating parameter (e.g., a temperature set point a fluid level set point, a pressure set point, a voltage set point, a current set point, and the like).

According to an embodiment of the disclosure, the TMC 100 may receive measurement signals from the plurality of sensors, which may include substantially real time measurement values for, for example, temperature, fluid level, pressure, voltage level, current level, and the like, in the transformer 200. The TMC 100 may compare the measured values (e.g., measurement signals) to respective threshold values, including, e.g., a temperature threshold value, a fluid level threshold value, a pressure threshold value, a voltage level threshold value, a current level threshold value, and the like. Based on the result of the comparison, the TMC 100 may generate a diagnosis signal, which may include an indication of one or more faults, one or more less-than-optimal performance characteristics in the transformer 200, or the like. For instance, the diagnosis signal may include an indication that the fluid level in the transformer 200 is below the fluid level threshold value, indicating, e.g., a fluid leak in the transformer 200 (e.g., a leaking fitting, gasket or the like). Further, the diagnosis signal may include an indication that the pressure in the transformer 200 is above (or below) a pressure threshold value, which may indicate, e.g., an abnormally functioning component in the transformer 200.

The respective threshold values may be programmed or preset. In an embodiment of the disclosure, the threshold values may be programmed or set by a user at the computer 300 and sent to the TMC 100 via the communication link(s) 500 and/or network 400. The threshold values may be stored in the memory (not shown) in the TMC 100. In generating a diagnosis signal, the TMC 100 may monitor, e.g., temperature, fluid level, and pressure over time to detect patterns that may be indicative of faults or improper operation of the transformer 200. For example, the TMC 100 may monitor the rate of change (e.g., rise or lowering) in the temperature, the rate of change (e.g., rise or lowering) in fluid level, and/or the rate of change (e.g., rise or lowering) in pressure.

The TMC 100 may monitor a relationship over time between temperature and fluid level, temperature and pressure, and fluid level and pressure to identify faults, improper operation, or less than optimal performance of the transformer 200. The TMC 100 may normalize the fluid level to temperature (or pressure), so as to provide increased accuracy by taking into consideration temperature (or pressure) effects on the fluid level over time (or during discrete intervals). In one aspect, a processor (e.g., 300, 600) may normalize the rate of change in the fluid level to the rate of change in the temperature. A rise or fall of the fluid level of a distance (e.g., 2", 3", 4", or other amount) is expected for every respective 10° C. rise or fall in the fluid temperature. Normalization can convert the fluid level at a temperature other than 25° to what the level would be at 25° to allow for comparison and trending, and potential fault detection.

The TMC 100 may monitor the rate of change of temperature in the transformer 200 relative to the rate of change in the fluid level (and/or pressure) in the transformer 200. The TMC 100 may further monitor the rate of change of the fluid level in the transformer 200 relative to the rate of change in pressure in the transformer 200. The TMC 100 may then generate a diagnosis signal based on the monitored rates of change in temperature, fluid level, and pressure, which indicates the operational status of the transformer 200, including potential faults or performance problems. This may also indicate a loss of oil in the transformer. The diagnosis signal may be sent from the TMC 100 to the computer 300 via the communication link(s) 500. As noted earlier, the TMC 100 may receive control signals, threshold values, and the like, from the computer 300. The processor (e.g., 300, 600) may monitor a rate of change in the temperature signal and a rate of change in the fluid level signal and a rate of change in the pressure level and outputs a signal based on a threshold being exceeded between any of these rate of change signals for detecting potential fault such as for determining a leak of oil.

Further, the TMC 100 may compare monitored levels (e.g., from the received measurement signals) to the threshold (or set point) values (e.g., stored in the TMC 110), and, if one or more levels are exceeded, the TMC 100 may generate an alarm signal that may be sent to the computer 300 or manifested locally at the TMC 100 as an audible signal, a visible signal, a vibration, or the like. For instance, the TMC 100 may measure the range of fluid level, pressure and temperature anticipated in the transformer 200. The TMC 100 may also provide the rate of rise of pressure for the SPR and output a measured pressure value, which may trigger an alarm condition should the measured pressure value reach or exceed a predetermined pressure threshold value. The user, using the computer 300 (or directly at the transformer 200), may take corrective action or logical action via the TMC 100, and more specifically the VCM 14 (140 or 1400) in the TMC 100. The corrective action may include, for example, actuating a fan to cool the transformer, actuating a pressure release valve, actuating a fluid injection valve, stepping down (or up) a voltage, dispatching a repair crew, switching to another transformer, or the like. The TMC 100 includes an internal memory (not shown) that may store measured parameters, predetermined set points, historical data, and the like.

The TMC 100 may process received pressure signals (e.g., pressure readings) to sense PRD and SPR conditions, as well as vacuum or pressure conditions. The TMC 100 may compare a sensed pressure to a preset level, triggering an alarm if the sensed pressure reaches or exceed the preset level. The alarm may include an alarm signal that is transmitted to the computer 300 (shown in FIG. 8).

The TMC 100 may process a received current transformer (CT) signal to calculate a winding temperature for the transformer 200. Moreover, the TMC 100 may measure the oil temperature in the transformer 200 such as by using a thermo couple (TC).

The TMC 100 may include, for example, fluid level detector which may comprise a magnetic encoder with a float arm to provide the information for the TMC 100 to calculate the fluid level in the transformer 200. The TMC 100 may further include a PLC and other components, which may be programmed to make calculations based on the received measurement signals and to display the physical quantities in common units such as PSI, degrees C. and inches on, for example, the computer 300.

The measurement signals that are received by the TMC 100 may include data samples that are taken periodically and stored in the memory (not shown). The data samples may be accessible for download (or upload) via the communication link(s) 500 and network 400 by the computer 300. This data samples may be charted and analyzed to determine abnormal conditions.

For example, the computer 300 (or TMC 100) may compare temperature behavior of the transformer 200 to the current flowing in one or more of the transformer 200 windings. If a determination is made that the temperature behavior does not correspond with the current flowing in the transformer winding(s), then a fault condition may be determined to exist within the transformer 200. A fault signal may be generated and sent for the transformer 200.

The TMC 100 may monitor other characteristics (or attributes) of the transformer 200, including, for example, an LTC (Load Tap Change) position, an LTC temperature, a dissolved gas value, and the like. The TMC 100 may collect and process the detected characteristics to relate the monitored characteristics to the transformer operation to analyze the conditions in the transformer 200. Moreover, the TMC 10 (or processor 600) may generate an alarm based any one or more received signal (e.g., a LTC position signal, a gas signal and the like).

The instant disclosure sets forth an approach that provides increased accuracy of measurement, by including, inter alia: solid state sensors that may provide analog signals with high accuracy and high reliability (compared to mechanical instruments); comparators that compare analog signals to programmed levels and logical decisions, generating comparison result signals that may be digitally communicated to a user located remotely at the computer 300; adjustable (or programmable) set points, which may be locally adjusted at the TMC 100 or the computer 300; and the like.

The TMC 100 simplifies the monitoring process of a transformer greatly. With the ability to download related data at any time, periodic variations in a unit can be compared, charted and analyzed to adjust for optimal settings and performance of the transformer unit. With the ability to make remote adjustments, time and expenses are spared for a customer in making these adjustments. Changes can be made that do not necessarily require the physical presence of sending a field service technician or maintenance personnel on site, thereby resulting in a very large savings. Efficiency and performance of the transformer itself are increased because of the automated process. From a manufacturing perspective, this module incorporates other functions that reduce manufacturing time and overall costs.

Table 1 illustrates a feature comparison between the VCM 14 (140 or 1400) of the present disclosure compared to existing ETM devices, including a Qualitrol 509 device, an Advanced TTC-1000 device, and an SEL 2414 device.

TABLE 1

ETM DEVICES

| VCM & VCM3 | Qualitrol 509 | Advanced TTC-1000 | SEL 2414 |
|---|---|---|---|
| Monitors liquid temp., winding temp, load current, oil level, mechanical alarm, ambient temp. | Monitors liquid temp., winding temp., load current, oil level, mechanical alarm, ambient temp. | Monitors liquid temp., winding temp., load current, ambient temp. | Monitors oil level, ambient temp., hot spot, sudden pressure, gas accumulation, load current |
| SCADA outputs (10-1 mA or 4-20 mA) | SCADA outputs(10-1 mA or 4-20 mA) | SCADA outputs(10-1 mA or 4-20 mA) | SCADA outputs(10-1 mA or 4-20 mA) |
| Optional LTC monitoring and gas monitoring | Integrated LTC differential temperature monitoring to detect LTC failures and provides advanced warning | Built in LTC condition monitoring, optional LTC position monitoring | Optional LTC oil monitoring |
| Data logging records activities and data is available for download | Sequence of events for data logging records activities at the time of an alarm | Data logging features permits recording of time stamped temperature and load data | Sequential event reporting and logging with synchronized time stamps |
| Compatible with RTD's, CT's | Compatible with RTD's, CT's, voltage, current loops and switch contacts | Compatible with RTD's, CT's | Compatible with RTD's, CT's |
| Control cooling fans | Control cooling fans and pumps | Control cooling fans and pumps | Control cooling fans |
| Panel mounting, NEMA 4x enclosure, NEMA 4x enclosure with heater available options | Panel mounting, NEMA 3R enclosure available options | Penal mounting NEMA 4X enclosure, NEMA 4X enclosure with heater available options | Panel mountain, surface mounting available options |
| Communications interface: RJ485, DNP 3.0 protocol or MODBUS | Communications interface: RS232, RS485, Fiber optic, USB, DNP 3.0 protocol or MODBUS | Communications interface: RS485, RS232, DNP 3.0 protocol or MODBUS | Communications interface: EIA 232, Fiber optic, EIA 485, DNP 3.0 protocol or MODBUS |
| Operating temp range: -40° C. to 85° C. Accepts up to 8 inputs. Output relays with Form C contacts | Operating temp range: -40° C. to +72° C. Accepts up to 8 inputs. Output relays with Form C contacts | Operating temp range: -50° C. to +85° C. Accepts up to 14 optically isolated digital inputs. Output relays with Form C contacts | Operating temp range: -40° C. to 85° C. Accepts up to 12 digital/analog inputs. Output relay with Form C contacts |
| Allows to calculate loss of life of transformer by generating hourly and daily data | TransLife feature allows to compute loss of life rate, life consumption and remaining life of the transformer | | Allows to calculate loss of life of transformer by generating hourly and daily data |

The TMC 100 provides various functions that lead to even greater advances in the protection and diagnosis of the operating conditions in transformers. By combining the disclosed functions and features into a single module, the long term operation of a power transformer may be monitored easily and corrective action taken in case of anomalous conditions. Thus, the maximum life of a transformer can be achieved.

According to an aspect of the disclosure, a computer readable medium is provided that contains a computer program, which when executed in, for example, the TMC 100 (or the computer 300) causes the processes described herein to be carried out. The computer program may be tangibly embodied in the computer readable storage medium, which may comprise a code segment or a code section for each of the steps described herein.

Figure 9:
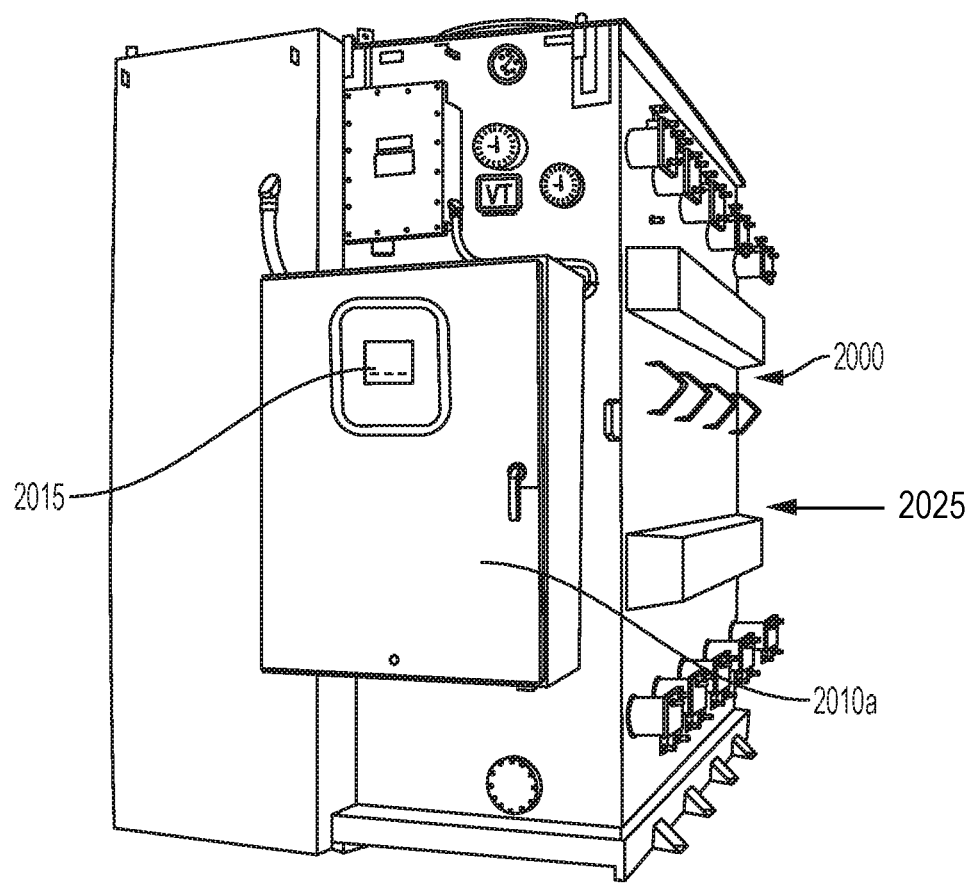
FIG. 9 shows an example of a transformer and a transformer monitoring/control system, configured on a junction box, constructed according to the principles of the disclosure.

FIG. 9 shows an example of a transformer and a transformer monitoring/control system 2000, configured on a junction box 2003 of a transformer, constructed according to the principles of the disclosure. The transformer 2052 includes a built-in package that includes a sensor box 2040, a dissolved gas analyzer (DGA) and moisture sensor, with at least one sensor, a plurality of sensors, or all sensors described herein, pre-wired. The built-in package may be installed during the manufacturing phase and the transformer shipped with the built-in package already configured for use.

Figure 22A:
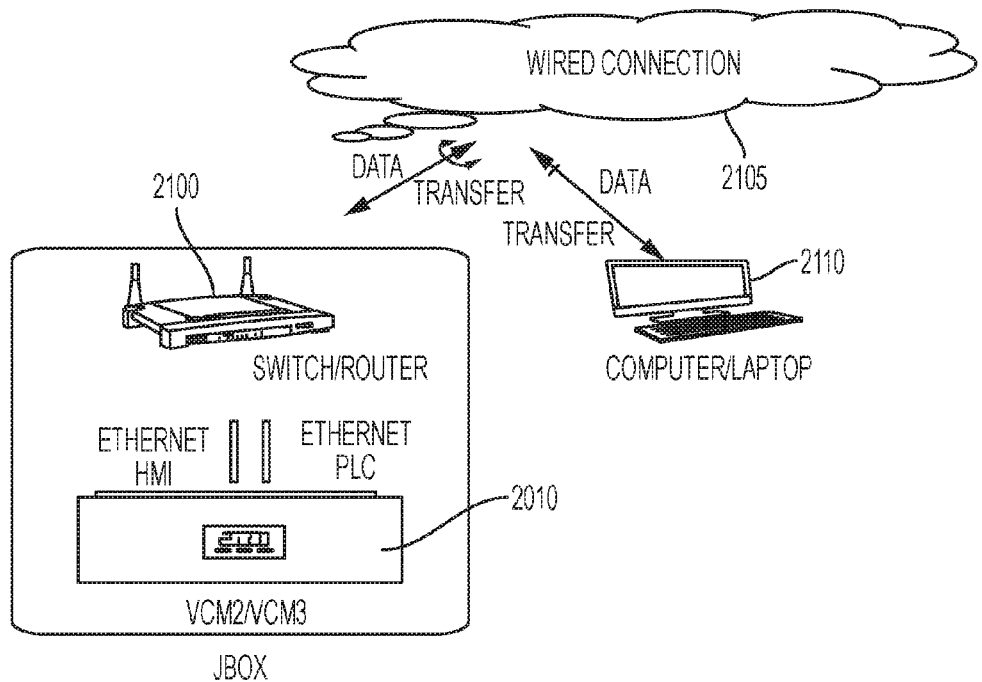
FIGS. 22A and 22B are diagrams of examples communication architectures including a remote computer, configured according to principles of the disclosure.
Figure 22B:
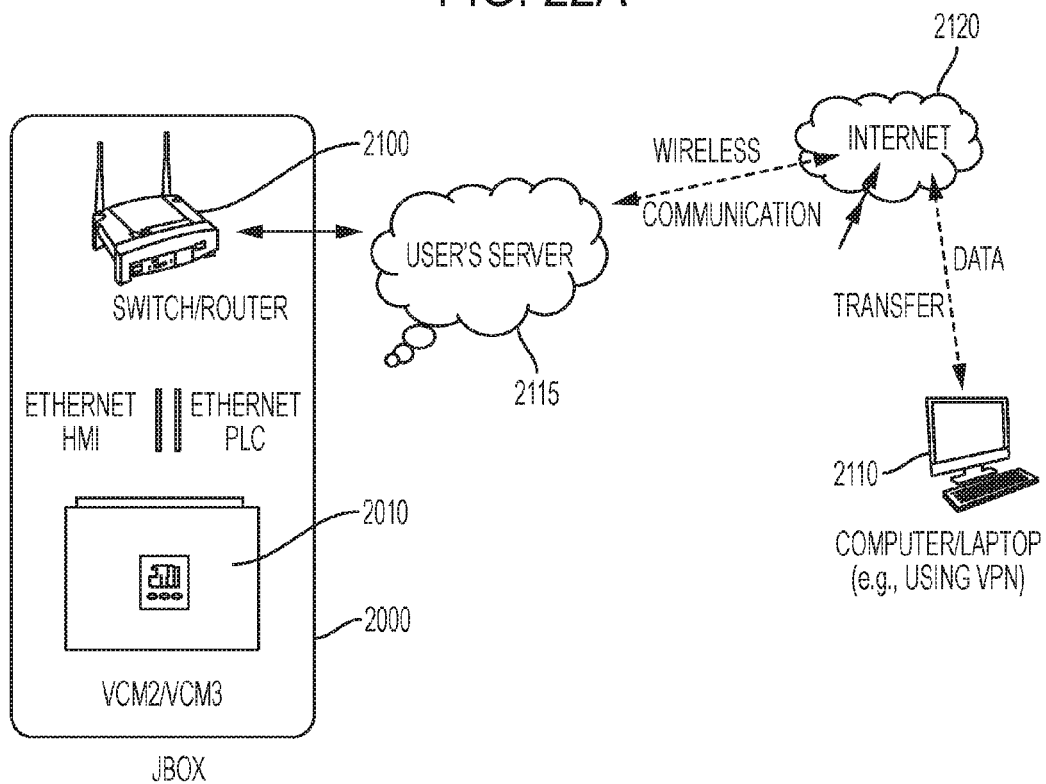

The transformer monitoring/control system 2000, generally referred to as a VCM3, may include a control module 2010a that serves as the primary controller and interface of the transformer monitoring/control system 2000. The control module 2010a may include a display module 2015 that permits various displays and statuses, describe below, to be output to maintenance personal, or similar personnel. The transformer monitoring/control system 2000 employs solid-state sensors that eliminate mechanical contacts for gauges. A PLC may integrate all contacts, including a Pressure Relief Device (PRD), alarm and Sudden Pressure (SP) Seal-In Relay. The display module 2015 may comprise a touch-screen, and may also emulate an annunciator. If any contact becomes disabled, an alarm message may be generated. Short circuit events are monitored and recorded, providing additional level of diagnostic information. The transformer monitoring/control system 2000 may automatically turn on fan banks 2051 (FIG. 12) at predetermined intervals, e.g., one week, two weeks, or the like, for a test for functionality. The fan bank test may be run also for a predetermined amount of time, e.g., 30 minutes, 60 minutes, or similar intervals. Any predetermined time period, setting or threshold herein may comprise a parameter that be programmable and changeable, such as from a remote programming station 2110 over a network 2120 or wired connection 2105 (FIG. 22A, 22B). Moreover, the fans may activate during operation whenever oil or winding temperatures reach a predetermined threshold.

Programming, maintenance and reporting data related to the transformer monitoring/control system 2000 may be compatible with supervisory control and data acquisition SCADA through Modbus or DNP3 protocols. The monitoring and diagnostic information from or to the transformer monitoring/control system 2000 may be accessed via wired or wireless using, e.g., a personal computer or a smart phone/tablet device.

Figure 10:
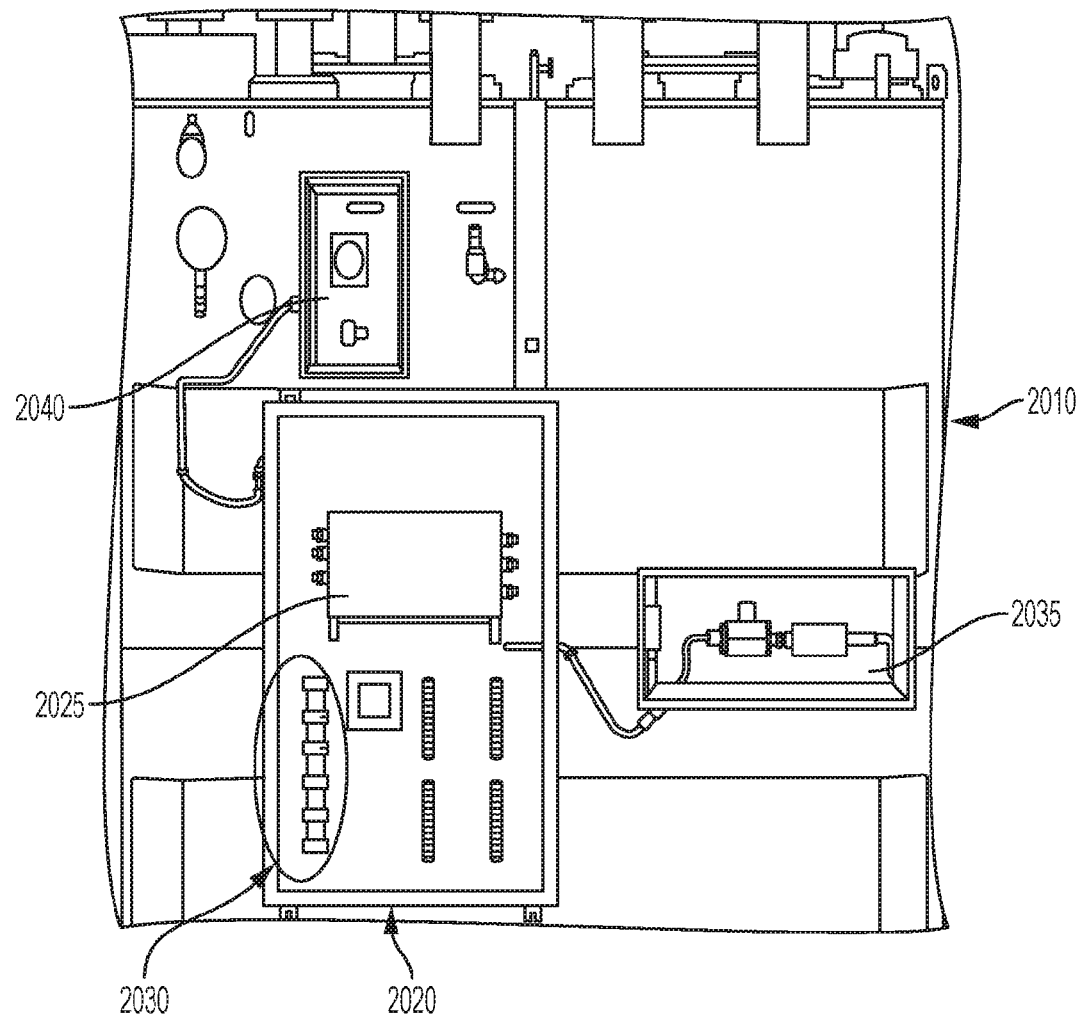
FIG. 10 is view of the interior of the control module 2 of FIG. 9, configured according to principles of the disclosure.

FIG. 10 is an example interior view of the control module 2010a, configured according to principles of the disclosure. The control module 2010a may include a controller enclosure 2020 and a controller 2025 that receives and processes inputs from a sensor box 2040 having a plurality of sensors related to transformer pressure, transformer liquid level, transformer oil temperature and ambient temperature, and in embodiments, other sensors described herein. Winding current sensors 2030 readable by controller 2025 sense winding currents from the transformer for detecting anomalies in winding currents for which alarms may be raised wherever the winding currents exceed predetermined parameters. Dissolved gas analyzer (DGA) and moisture sensor 2035 readable by controller 2025 is configured to perform on-line dissolved gas analysis (DGA) for four composite gases including H2, CO, $C_2H_2$ and $C_2H_4$. Moreover, moisture content in both the oil within the transformer along with the paper insulation may be monitored by the dissolved gas analyzer and moisture sensor 2035. The DGA analysis may be obtained by the installation of an analyzer in the oil convection path to ensure that earliest indication of the formation of dissolved gases in the transformer oil. Thresholds for the dissolved gases, with a default factory setting of the condition 3 and condition 4 limits as prescribed in IEEE Std. C57.104-2008, can be programmed locally or remotely. These features combine to provide a basis for loss-of-life of the transformer. Loss-of-life may be calculated at a predetermined interval such as, e.g., hourly, monthly, yearly. The transformer monitoring/control system 2000 may store all sensor data for retrieval and trend analysis at any time. Any transformer condition during operation that may affect the life and performance of the transformer may automatically signal an alarm. The alarm may be local on display 2015 and or to a remote monitoring center (e.g., computer 2110, FIGS. 22A, 22B). For a detected fault, a diagnosis and recommendation for corrective action may also be displayed locally and/or remotely. Moreover, a regular, e.g. monthly or quarterly, "health-check-up" analysis of the transformer may be performed and made available.

Figure 11:
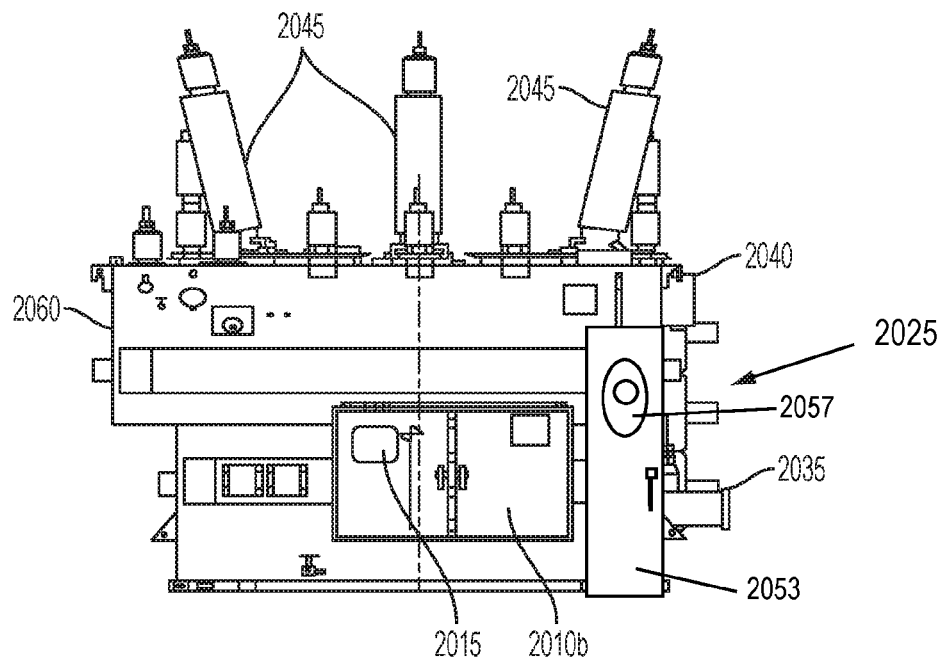
FIG. 11 is a front view of an embodiment of component placement of a transformer monitoring/control system, constructed according to the principles of the disclosure.
Figure 12:
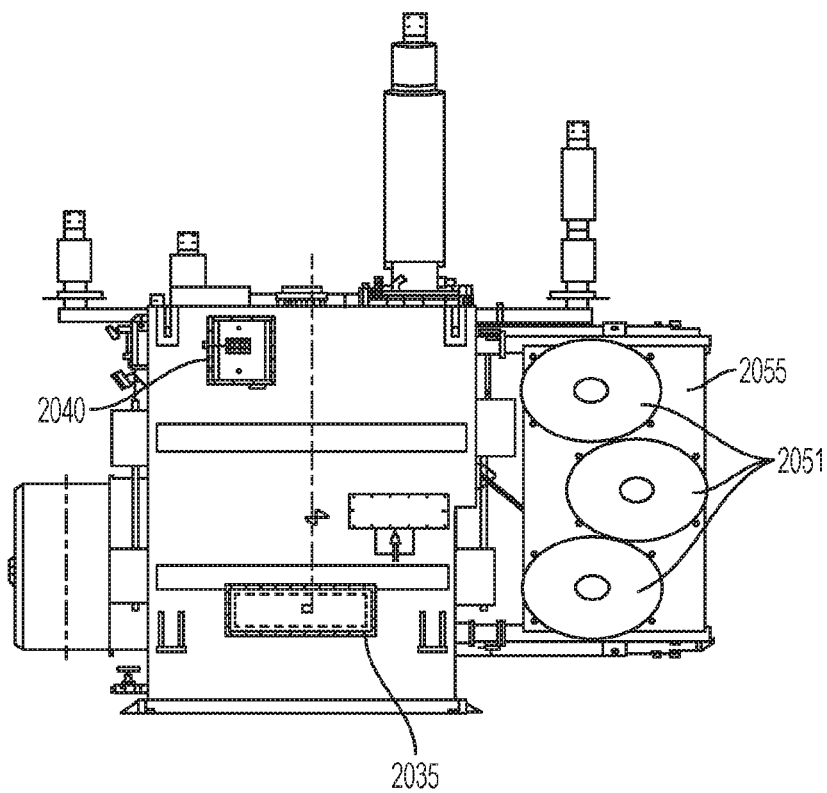
FIG. 12 is a right view of FIG. 11.

FIG. 11 is a front view and FIG. 12 is a right view of an embodiment of component placement of a transformer monitoring/control system 2000, constructed according to the principles of the disclosure. In this embodiment, dissolved gas analyzer and moisture sensor 2035 may be located on the right side of the junction box 2003, while control module 2010b and display 2015 may be arranged on the front of the junction box 2003. Also shown are cooling fans 2051 arranged proximate transformer fins 2055 of transformer 2052. Bushings 2045 are also shown on the transformer 2052.

Figure 13:
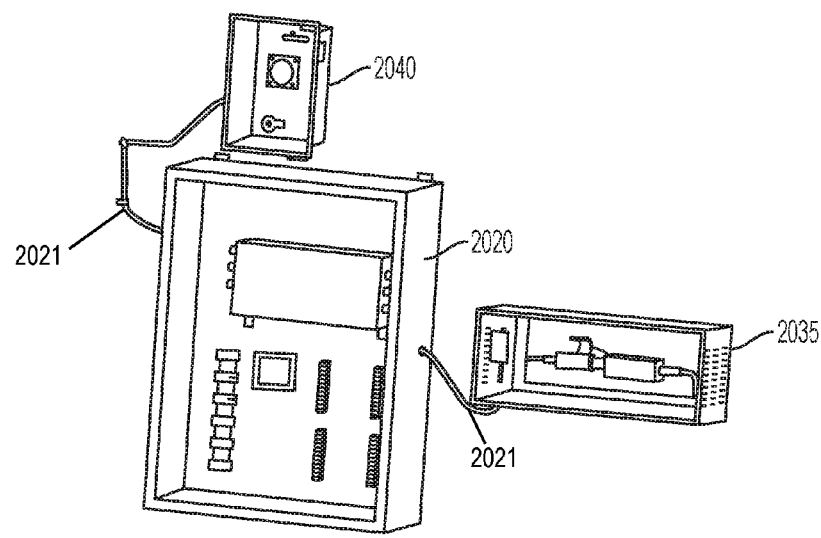
FIG. 13 is an illustration of an example of a transformer monitoring/control system, constructed according to the principles of the disclosure.

FIG. 13 is an illustration of an example of a transformer monitoring/control system 2000, constructed according to the principles of the disclosure. The illustration of FIG. 13 shows more clearly the interconnection of the dissolved gas analyzer (DGA) and moisture sensor 2035 and sensor box 2040 with controller enclosure 2020. The moisture sensor may measure moisture in PPM. The communication link 2021 may interconnect any or all sensors to the controller 2025.

Figure 14:
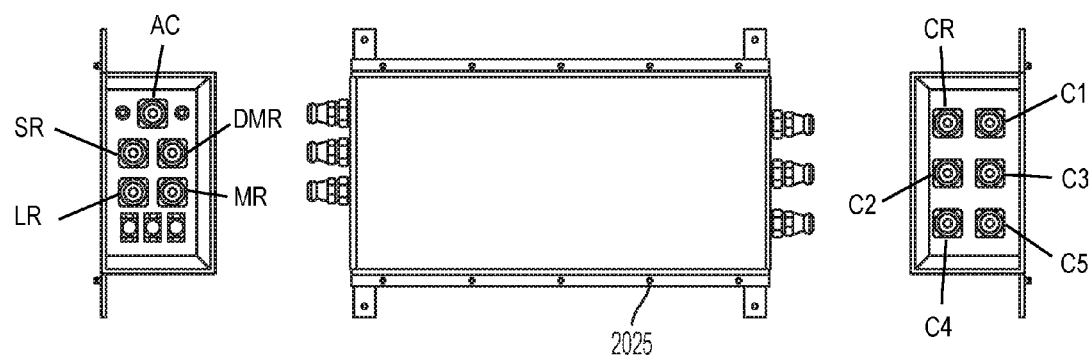
FIG. 14 is an illustration of the controller and associated connectivity, configured according to principles of the disclosure.

FIG. 14 is an illustration of the controller 2025 and connectivity, configured according to principles of the disclosure. The 6 connectors on the right hand side of the controller are output connections. These outputs include connectors CR, C1, C2, C3, C4, and C5. CR outputs the winding current, the short circuit current and the power for the HMI. C1 outputs the cooling fan activations, alarms and trips. C2 is for the fail safe operation and status indication. C3 outputs loss of life alarms, DGA condition alarms and the moisture in oil and paper alarms. C4 outputs alarms from the LTC on positions, operations and temperatures. C5 outputs the levels and pressures alarms and trip on the transformer 200 tank and the nitrogen system. The 5 connectors on the left hand side are inputs for AC—for the power supply to the controller 2025; SR—for the fluid temperature, fluid level and pressure inputs from the sensors; DMR for the DGA and moisture inputs from the sensors; LR—for the LTC temperature and tap position indication inputs; and MR—for the ambient temperature, nitrogen system pressure and fan status inputs to the controller 2025. The 3 ports on the bottom row (left hand side) are for connectors to the processor, HMI and a spare for future use. The 2 ports either side of the connector on the top row of the left hand side are for 2 A fuses for the 120/240VAC supply and the 24VDC distribution.

Figure 15A:
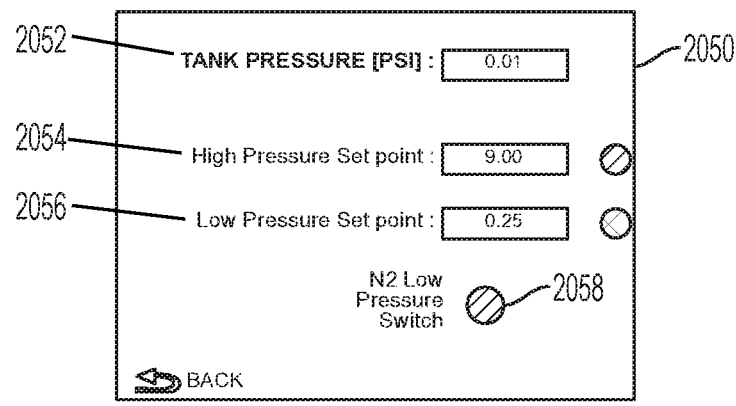
FIG. 15A is an illustration of a graphical user interface for tank pressure, configured according to principles of the disclosure.

FIG. 15A is an illustration of a graphical user interface 2050 for tank pressure, configured according to principles of the disclosure. The graphical user interface 2050 may be controlled by controller 2025. The display device 2015 may also be a touch sensitive input device. FIG. 15A illustrates a user selectable display (i.e., a user may navigate to this display), showing tank pressure 2050 of a transformer in pounds per square inch (PSI). Also shown are current high Pressure set point 2054 and low pressure set point 2056. These reflect predetermined parameters settable by a user either locally or remotely. If a pressure within the transformer exceeds either of these parameters, an alarm is raised and may be logged. Moreover, notification messaging may be sent to a remote center. A low pressure switch indicator 2058 may also be illuminated. The nitrogen system 2053 has a nitrogen bottle 2057. If pressure in the nitrogen bottle 2057 goes below a programmable set point (and may be remotely programmable by computer 2110), an alarm may be raised, may be logged and a low pressure switch indicator may be illuminated.

Figure 15B:
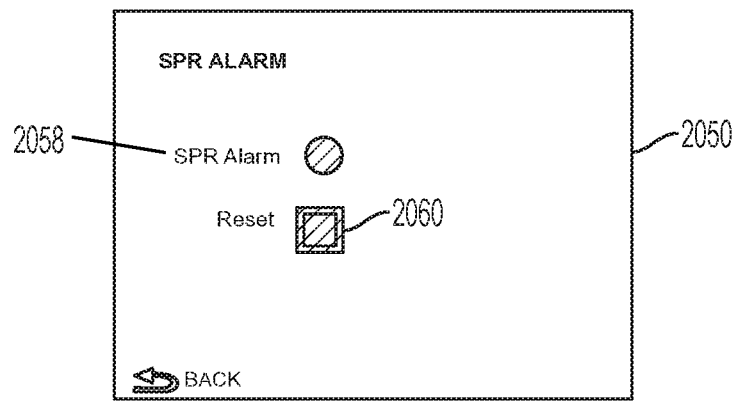
FIG. 15B is an illustration of a graphical user interface 2050 showing sudden pressure relay (SPR) alarm, configured according to principles of the disclosure.

FIG. 15B is an illustration of a graphical user interface 2050 showing sudden pressure relay (SPR) alarm, configured according to principles of the disclosure. The system 2000 may detect pressure relief device (PRD) operation of the transformer (which releases excess pressure). A rapid pressure rise may latch a rapid pressure relay contact. As a consequence, a sudden pressure relay alarm indicator 2058 may be raised (e.g., a color change from green to red) indicating sudden pressure in the transformer 2052. A reset input 2060 may be selected by a user to clear the indicator and/or acknowledge receipt of the alarm. The reset action may be logged.

Figure 15C:
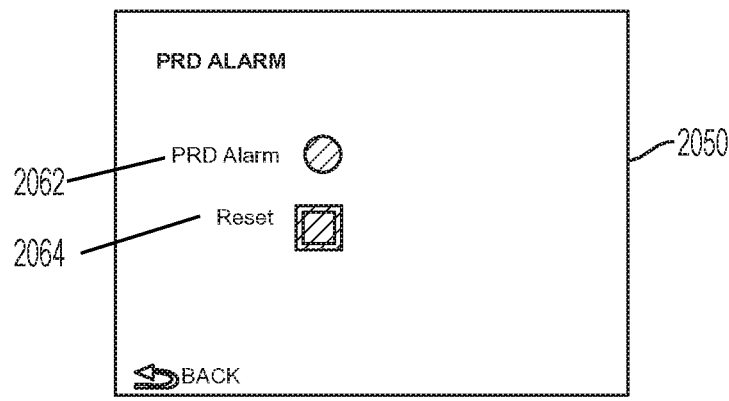
FIG. 15C is an illustration of a graphical user interface showing sudden pressure relay (SPR) alarm, configured according to principles of the disclosure.

FIG. 15C is an illustration of a graphical user interface 2050 showing sudden pressure relay (SPR) alarm, configured according to principles of the disclosure. Status 2062 of a pressure release device may be shown such as color coded, e.g., green is normal and red indicates the PRD operated. A reset input 2064 may be operated by a user to acknowledge and/or reset the alarm. The SPR alarm may be conveyed to a remote monitoring center also.

Figure 16:
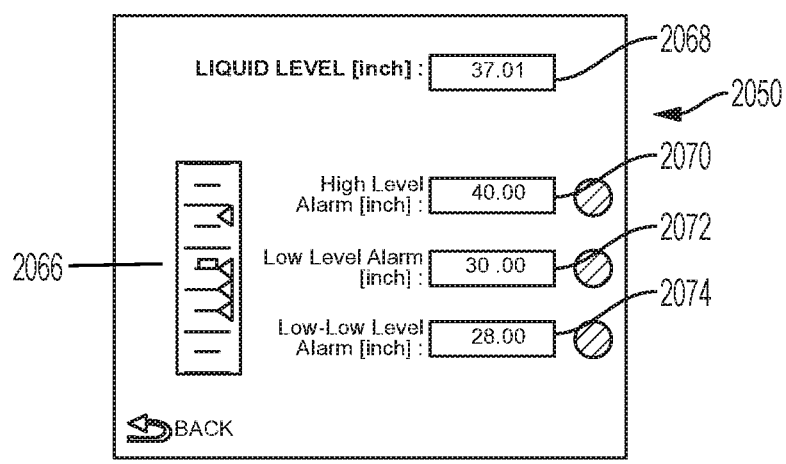
FIG. 16 is an illustration of a graphical user interface showing transformer liquid level, configured according to principles of the disclosure.

FIG. 16 is an illustration of a graphical user interface 2050 showing transformer liquid level, configured according to principles of the disclosure. The current liquid level 2068 of a transformer 2052 may be displayed, such as in inches or a metric unit. A visual level indicator 2066 pictorially and simultaneously shows the current high level, low level and low-low level predetermined settings along with current liquid level. Also, a numeric readout of the current high level 2070 setting parameter with alarm indicator, low level 2072 alarm setting parameter with alarm indicator, and a low-low level 2074 setting parameter with alarm indicator may be provided. Whenever one of these predetermined parameters is exceeded, an alarm is raised and may be remotely reported. These predetermined parameters may be remotely established and set at system 2000. Setting any predetermined parameters herein may require a login and a password to change.

Figure 17:
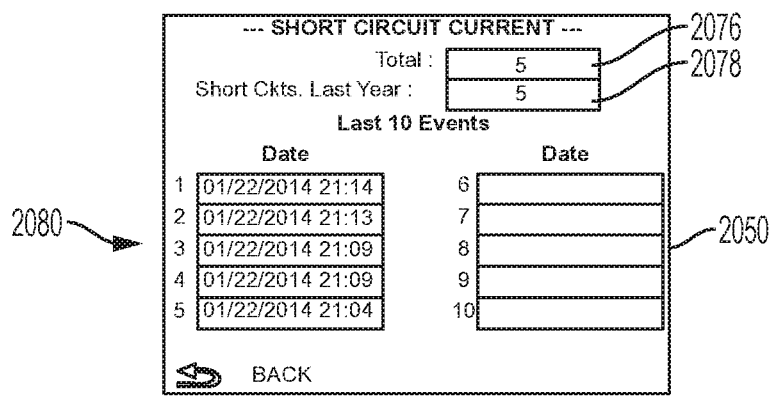
FIG. 17 is an illustration of a graphical user interface showing a history of any short circuit, configured according to principles of the disclosure.

FIG. 17 is an illustration of a graphical user interface 2050 showing a history of any short circuit, configured according to principles of the disclosure. A total of short circuits 2076 related to the transformer 2052 may be displayed, which may be cumulative and may be cleared upon command from a user. Moreover, a count 2078 of short circuits over a predetermined time period, e.g., one year, may be displayed. A history log 2080 showing short circuit events, e.g., up to 10 events, may be displayed.

Figure 18:
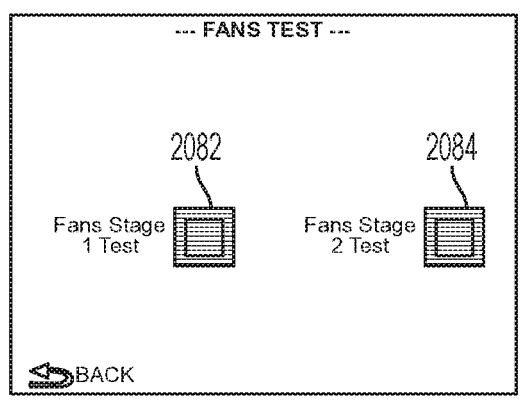
FIG. 18 is an illustration of a graphical user interface showing a fans test, configured according to principles of the disclosure.

FIG. 18 is an illustration of a graphical user interface 2050 showing a fans test, configured according to principles of the disclosure. Fans 2051 operation may be continuously monitored by measuring the current in the cooling fans 2051. Failure of any fan may be detected and logged and reported as an alarm. A power failure at system 2000 may cause fans 2051 to be turned on automatically. Moreover, fan bank tests 2082, 2084 may be requested by a user and any faults displayed as shown.

Figure 19A:
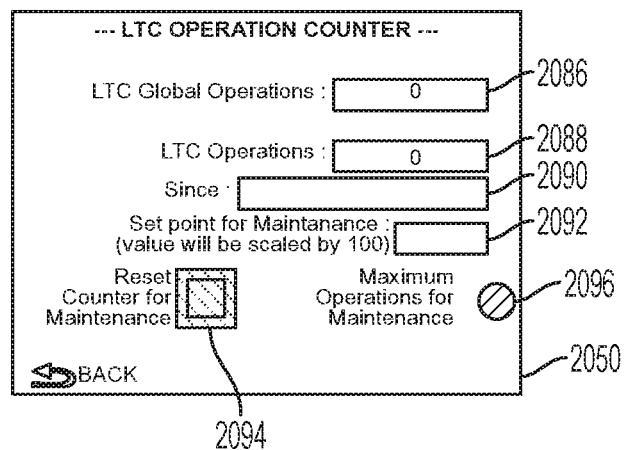
FIG. 19A is an illustration of a graphical user interface showing LTC monitoring, configured according to principles of the disclosure.

FIG. 19A is an illustration of a graphical user interface 2050 showing LTC monitoring, configured according to principles of the disclosure. LTC monitoring provides an operational counter with a continuous display of LTC operations globally 2086 and LTC operations 2088 since a predetermined date 2090. LTC globally 2086 is the number of LTC operations from when the system was commissioned and cannot be reset in the field, whereas LTC operations 2088 is the number of LTC operations since a particular date 2090, and may be resettable in the field or remotely reset.

Figure 19B:
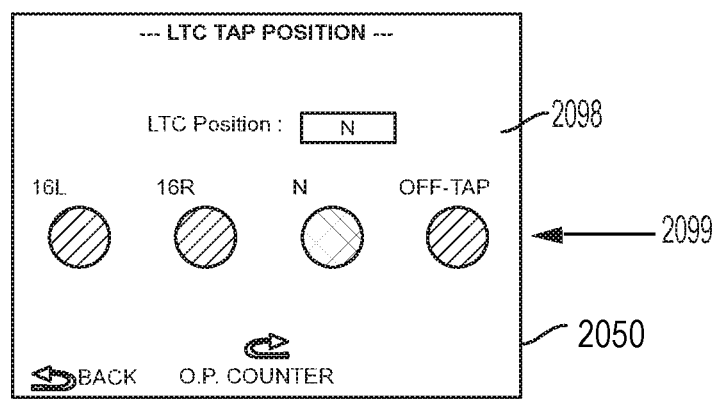
FIG. 19B is an illustration of a graphical user interface showing LTC TAP positions, configured according to principles of the disclosure.

A set point 2092 for LTC maintenance may be displayed, the set point may be programmable. If this set point 2092 is exceeded, alarm 2096 may be raised, locally and/or remotely. A reset of this LTC operations counter 2088 may be achieved by activating reset 2094. FIG. 19B is an illustration of a graphical user interface 2050 showing LTC TAP positions, configured according to principles of the disclosure. LTC position indicator 2098 shows a current position of the LTC. Indicators 2099 may show when the LTC tap is in one of four states. When not in any one of these four states, indicators 2099 are illuminated green. The illumination on the "16L", "16R", or "N" turn color (e.g., orange) when the LTC tap is in that position, and the "Off-tap" changes to a red illumination when the tap is not in a recognized position.

Figure 19C:
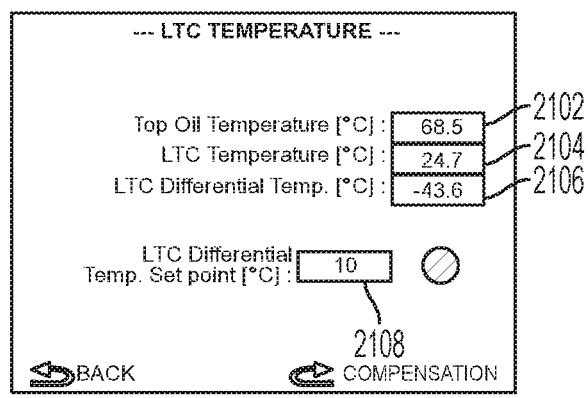
FIG. 19C is an illustration of a graphical user interface showing LTC temperature, configured according to principles of the disclosure.

FIG. 19C is an illustration of a graphical user interface 2050 showing LTC temperature, configured according to principles of the disclosure. The system 2000 measures oil temperature of the main transformer 2052 and the LTC. These are displayed as top oil temperature 2102 and LTC temperature 2104, with the LTC differential temperature set point 2106. If a difference (i.e., the differential temperature) is found greater than a predetermined value, an alarm may be raised. LTC differential temperature may be an indication of wearing of contacts of an LTC unit.

Figure 20A:
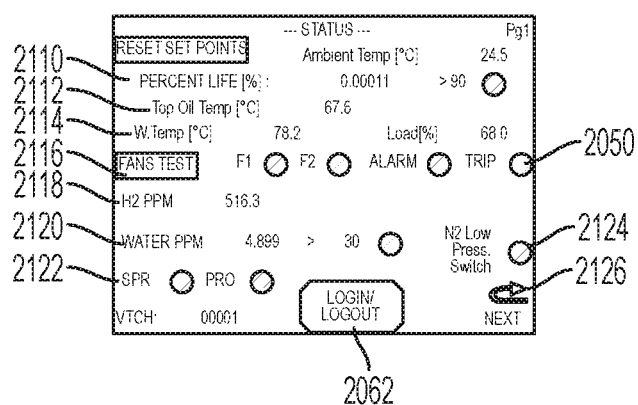
FIGS. 20A and 20B are illustrations of graphical user interfaces 2050 showing a built-in annunciator, configured according to principles of the disclosure.
Figures 20B, 21:
FIG. 21 is an illustration of graphical user interface showing sensor/transducer statuses, configured according to principles of the disclosure.

FIGS. 20A and 20B are illustrations of graphical user interfaces 2050 showing a built-in annunciator, configured according to principles of the disclosure. The annunciator 2126 may include a summary of a plurality of statuses. In this way, a person may view overall status of the transformer 2052 in one view. The annunciator may include: a percent life readout 2110, top oil temperature 2112, winding temperature 2114, fan test 2116 and any alarms, $H_2$ PPM 2118, water PPM 2120, SPR and PRD 2122 alarms, $N_2$ low indicator 2124. Moreover, a login/logout option 2062 may be presented to a user. A second page of annunciator may be viewed by selecting the "next" option, which is shown in FIG. 20B. In FIG. 20B the tank pressure 2128 may be displayed. Counts 2130 of short circuits over the last predetermined time period and cumulative may be displayed. LTC tap positions 2132 and LTC alarm statuses 2136 may also be displayed. A count 2134 of LTC operations with a time interval may be displayed, along with LTC temperature differential. As shown, the transformer liquid level may also be displayed along with alarms indicators for Hi, Low, Low-Low levels.

FIG. 21 is an illustration of graphical user interface 2050 showing sensor/transducer statuses, configured according to principles of the disclosure. This display provides status of various sensors (which may be solid state sensors) and/or transducers in contact with the transformer and include:

1) Top Oil Thermocouple is connected or not.
2) Ambient Thermocouple is connected or not.
3) LTC Thermocouple is connected or not.
4) Liquid Level Transducer is connected or not.
5) Pressure Transducer is connected or not.
6) Winding Temperature Indication (WTI) Transducer is connected or not.//**
7) Short Circuit Counter (SCC) Transducer connected or not.
8) LTC position transducer connected or not.
9) Moisture Transducer connected or not.
10) $H_2$ Transducer connected or not.

FIGS. 22A and 22B are diagrams of examples communication architectures including a remote computer, configured according to principles of the disclosure. The control module 2010 may communicate via a switch/router 2100 across either a wired 2105 connection or a network 2120 to a remote computer 2110 that may function as a remote control station. A server 2115 may be employed to facilitate communications between the switch/router 2100 and a network 2120, which may be the Internet. The network 2120 may include a wireless network. A user at computer 2110 may program the various predetermined thresholds and/or parameters as described in relation to system 2000. Moreover, any log or alarm including information displayable on graphical user interface 2050 may be viewed at computer 2110. A virtual protocol network may be utilized between the system 200 and computer 2110. Computer 2110 may comprise a smart phone or tablet computer. Moreover, maintenance actions or alarm resets may be instituted at computer 2110. A password and login may be required of a user before accessing any information at system 2000. The computer 2110 may also compute loss-of-life of the transformer based on received signals from controller 2025 that receives inputs from the various sensors.

Figure 23:
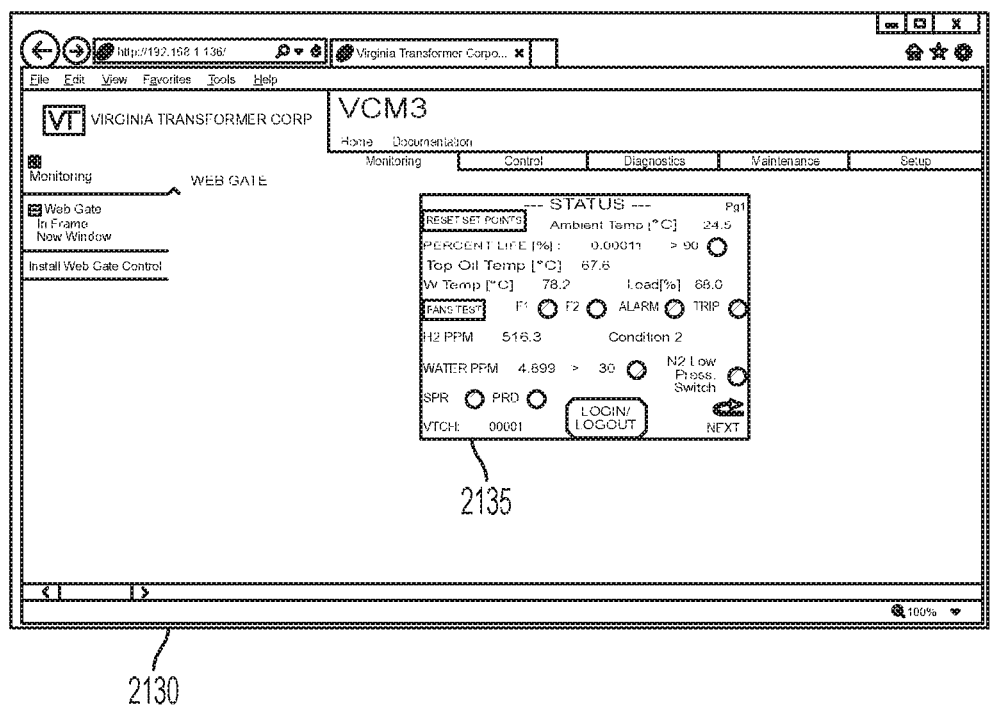
FIG. 23 is an illustration of an example graphical user interface 2130 that may be displayed at computer 2110 for use by technical personnel.

The transformer monitoring/control system 2000 may log historical events as described herein and may communicate the log to the remote computer, e.g., 2110. FIG. 23 is an illustration of an example graphical user interface 2130 that may be displayed at computer 2110 for use by technical personnel. This display 2130 provides a summary of various measurements and alarms 2135 such as previously described in relation to FIG. 20A. Corrective action may be undertaken by personnel at a remote Monitoring Control Center, e.g., at computer 2110, for any abnormal condition that has been diagnosed. Recommended actions may be provided to the personnel for maintenance or corrective action to maintain the transformer 2052 in satisfactory operating condition. The combination for recommendations and corrective actions may avoid unscheduled interruptions and may extend life to the unit, perhaps up to 60 or more years. In the event of a potential adverse condition within the transformer 2052, the system 200 may send an alarm to computer 2110, which may be a smart phone, tablet or other WI-FI device.

Figure 24:
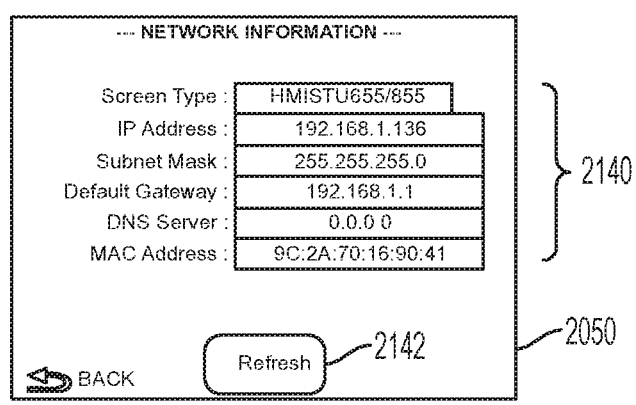
FIG. 24 illustrates a graphical user interface 2050 for viewing network information such as address assignments 2140 of system 2000, configured according to principles of the disclosure.

FIG. 24 illustrates a graphical user interface 2050 for viewing network information such as address assignments 2140 of system 2000. This may include an assignment IP address, Subnet mask, default gateway address, DNS server address, and MAC address. These various network address assignments 2140 can only be viewed through a secure login. The IP address of system 2000 can be defined and allocated to the system 2000. A refresh function 2142 may be used to refresh the network information.

Figure 25A:
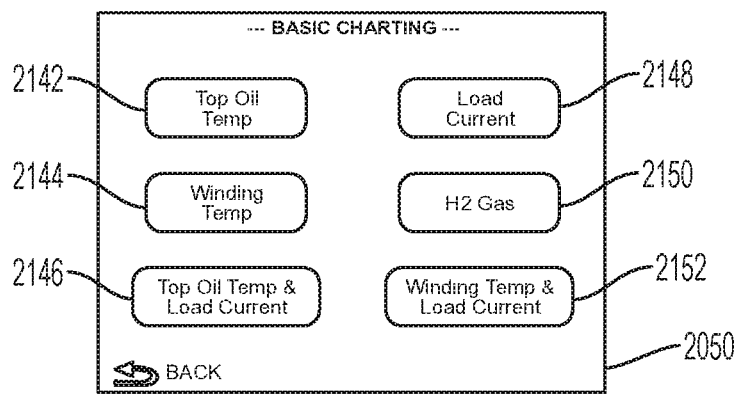
FIG. 25A is an example of a graphical user interface for use by a user to chart recorded transformer parameters, configured according to principles of the disclosure.
Figure 25B:
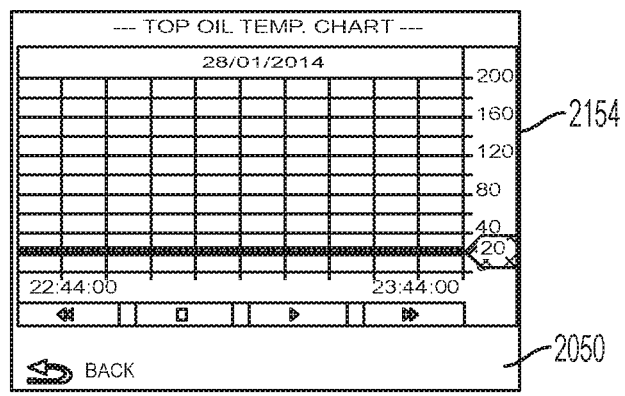
FIG. 25B is an example chart showing a graph of Top Oil Temperature, configured according to principles of the disclosure.

FIG. 25A is an example of a graphical user interface 2050 for use by a user to chart recorded transformer parameters. Basic charting may be selected from among: Top Oil Temperature 2142, Winding temperature 2144, Top Oil Temperature and Load Current 2146, Load Current 2148, H2 Gas levels 2150, Winding temperature and Load Current 2152. FIG. 25B is an example chart showing a graph 2154 of Top Oil Temperature, configured according to principles of the disclosure, and generated by system 2000 by selecting Top Oil Temperature 2142. The Top Oil temperature is charted versus time period. The other selections of FIG. 25A produce similar charts.

Figure 25C:
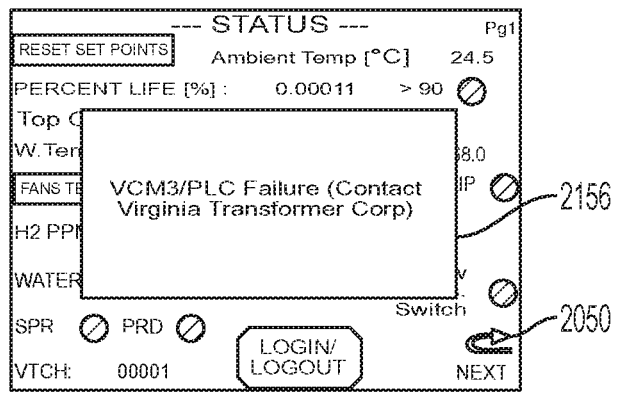
FIG. 25C is an illustration of a graphical user interface showing that an abnormal condition has occurred.
Figure 26:
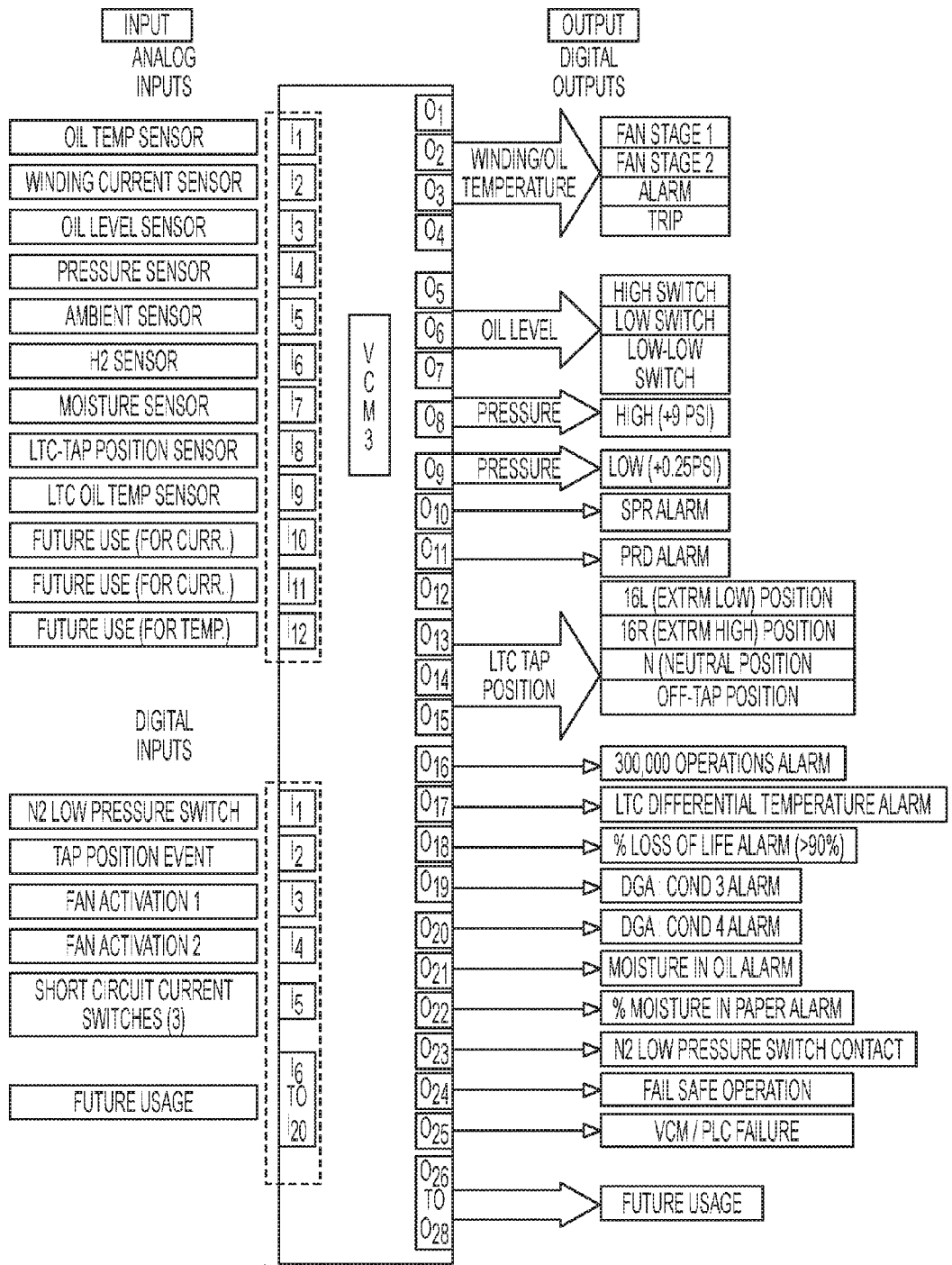
FIG. 26 is an illustration of the inputs and outputs of the controller of the transformer monitoring/control system 2000, configured according to principles of the disclosure.

FIG. 25C is an illustration of a graphical user interface 2050 showing that an abnormal condition has occurred. This may be, e.g., a failure of the PLC of the transformer monitoring/control system 2000. A failure alarm 2156 may be activated in this condition FIG. 26 is an illustration of the inputs and outputs of the controller of the transformer monitoring/control system 2000, configured according to principles of the disclosure. The controller 2025 which may comprise a PLC (e.g., such as PLC Micrologix 1766-L32BWA), may include the following:

Analog Inputs:
I1: Oil Temperature Sensor
I2: Winding Current Sensor
I3: Oil Level Sensor
I4: Pressure Sensor
I5: Ambient Temperature Sensor
I6: $H_2$ Sensor
I7: Moisture Sensor
I8: LTC-TAP Position Sensor
I9: LTC Oil Temperature Sensor
I10: Future Use
I11: Future Use
I12: Future Use Digital Inputs:
I1: $N_2$ Low Pressure Switch
I2: TAP Position Event
I3: Fan activation 1
I4: Fan Activation 2
I5: Short Circuit Current Switches Digital Outputs

| | | |
|---|---|---|
| O1: | Fan Stage 1 | (O1-O4 for Winding/Oil Temperature) |
| O2: | Fan Stage 2 | |
| O3: | Alarm | |
| O4: | Trip | |
| O5: | High Switch | (O5-O7 for Oil Levels) |
| O6: | Low Switch | |
| O7 | Low-Low Switch | |
| O8 | High Pressure in Transformer | |
| O9: | Low Pressure in Transformer | |
| O10: | SPR Alarms | |
| O11: | PRO Alarm | |
| O12: | 16L (External Low) Position | (O12-O15 for LTC TAP) |
| O13: | 16R (External High) Position | |
| O14: | N (Neutral) Position | |
| O15: | Off-TAP | |
| O16: | 300,000 Operations Alarm | |
| O17: | LTC Differential Temperature Alarm | |
| O18: | % Loss of Life Alarm (>90%) | |
| O19: | DGA: Condition 3 Alarm | |
| O20: | DGA Condition 4 Alarm | |
| O21: | Moisture in Oil Alarm | |
| O22: | % Moisture in Paper Alarm | |
| O23: | N2 Low Pressure Switch Contact | |
| O24: | Fail Safe Operation | |
| O25: | VCM/PLC Failure | |

While the disclosure has been described in terms of exemplary embodiments, those skilled in the art will recognize that the disclosure can be practiced with modifications in the spirit and scope of the appended claims. These examples are merely illustrative and are not meant to be an exhaustive list of all possible designs, embodiments, applications or modifications of the disclosure. Moreover features of one example or embodiment may be employed with other examples or embodiments.

What is claimed:

1. A system for monitoring operating parameters of a transformer, the system comprising:
   a temperature sensor that measures temperature in the transformer and outputs a temperature signal;
   a winding current sensor that measures current in the windings of the transformer and outputs a current signal; and
   a processor that wirelessly receives the temperature signal and the current signal, wherein the processor calculates at regular time intervals at least one percentage loss of life value of the transformer over a life of the transformer based on a plurality of: the temperature signal, the current signal, a thermal capacity of the transformer, oil and winding-time constants, winding gradients, and ambient temperature.

2. The system of claim 1, wherein the processor further calculates the percentage of loss of life based on moisture content in both of: the transformer and paper insulation.

3. A system for monitoring operating parameters of a transformer, the system comprising:

a temperature sensor that measures temperature in the transformer and outputs a temperature signal;

a winding current sensor that measures current in the windings of the transformer and outputs a current signal;

a dissolved gas sensor to measure dissolved gases in the transformer;

a sensor that senses the load tap changer (LTC) tap position from among a plurality of positions and outputs a LTC position signal; and a processor that receives over a wireless communication link the temperature signal and the current signal, wherein the processor calculates a percentage loss of life values of the transformer based on a plurality of: the temperature signal, the current signal, a thermal capacity of the transformer, oil and winding-time constants, winding gradients, and ambient temperature, and the processor receives over the wireless communication link the measured dissolved gas and raising an alarm when the level of dissolved gas exceeds a predetermined threshold, and the processor receives the LTC position signal and generates a diagnosis signal based on the LTC position signal, and the processor receives over the wireless communication link one or more signals that convey information from a plurality of transformer sensors, the information including sensed LTC tap position from among a plurality of LTC positions, dissolved gas level, oil temperature, fluid level, pressure level and transformer winding current;

wherein the processor is configured to program threshold levels over the wireless communication link related to a plurality of sensors.

4. The system of claim 3, wherein the plurality of sensors comprise a built-in package pre-installed during the transformer manufacturing stage.

5. The system of claim 1, wherein the processor calculates an aging acceleration factor to obtain an equivalent aging for a predetermined interval.

6. The system of claim 1, wherein the processor calculates the percentage loss of life value of the transformer over a programmable predetermined period of time.

7. The system of claim 1, wherein the processor calculates the percentage loss of life value of the transformer over regular time intervals or over total life of the transformer.

8. The system of claim 1, wherein the processor calculates a percentage loss of life value of the transformer based on at least four of: the temperature signal, the current signal, a thermal capacity of the transformer, oil and winding-time constants, winding gradients, concentration of dissolved gas in oil, and ambient temperature.

9. The system of claim 1, wherein the processor calculates a percentage loss of life value of the transformer based on at least five of: the temperature signal, the current signal, a thermal capacity of the transformer, oil and winding-time constants, concentration of dissolved gas in oil, winding gradients, and ambient temperature.

* * * * *